United States Patent
Fujita et al.

(10) Patent No.: US 8,399,173 B2
(45) Date of Patent: Mar. 19, 2013

(54) RESIST COMPOSITION AND RESIST PATTERN FORMING METHOD

(75) Inventors: Shoichi Fujita, Kawasaki (JP); Kazuyuki Nitta, Kawasaki (JP); Tomoharu Takahashi, Kawasaki (JP); Hirokazu Ozaki, Kawasaki (JP)

(73) Assignee: Tokyo Ohka Kogyo Co., Ltd., Kawasaki-shi (JP)

( * ) Notice: Subject to any disclaimer, the term of this patent is extended or adjusted under 35 U.S.C. 154(b) by 533 days.

(21) Appl. No.: 11/996,044

(22) PCT Filed: May 18, 2006

(86) PCT No.: PCT/JP2006/309897
§ 371 (c)(1), (2), (4) Date: Jan. 17, 2008

(87) PCT Pub. No.: WO2007/010666
PCT Pub. Date: Jan. 25, 2007

(65) Prior Publication Data
US 2009/0258313 A1    Oct. 15, 2009

(30) Foreign Application Priority Data
Jul. 20, 2005 (JP) .................................. 2005-210064

(51) Int. Cl.
*G03C 1/00* (2006.01)
*G03F 7/00* (2006.01)
(52) U.S. Cl. ..................................... 430/270.1; 430/325
(58) Field of Classification Search ................ 430/270.1
See application file for complete search history.

(56) References Cited

U.S. PATENT DOCUMENTS

| | | | |
|---|---|---|---|
| 5,908,730 A | 6/1999 | Nitta et al. | |
| 2002/0076649 A1* | 6/2002 | Kumon et al. | 430/271.1 |
| 2002/0132181 A1* | 9/2002 | Nishimura et al. | 430/270.1 |
| 2003/0022098 A1* | 1/2003 | Koes | 430/270.1 |
| 2003/0044716 A1* | 3/2003 | Cameron et al. | 430/270.1 |
| 2004/0040377 A1 | 3/2004 | Tanimoto et al. | |
| 2004/0072097 A1* | 4/2004 | Kodama | 430/270.1 |
| 2004/0161710 A1 | 8/2004 | Endo et al. | |

FOREIGN PATENT DOCUMENTS

| | | |
|---|---|---|
| EP | 1308781 A2 * | 5/2003 |
| JP | 2881969 | 2/1992 |
| JP | 09-208554 | 8/1997 |
| JP | 11-035551 | 2/1999 |
| JP | 11-035552 | 2/1999 |
| JP | 11-035573 | 2/1999 |
| JP | 11-095434 | 4/1999 |
| JP | A-11-322707 | 11/1999 |
| JP | 2000-147771 | 5/2000 |
| JP | 2002-169288 | 6/2002 |
| JP | 2002-357903 | 12/2002 |
| JP | 2003-177516 | 6/2003 |
| JP | 2003-241385 | 8/2003 |
| JP | 2004-151486 | 5/2004 |
| JP | 2004-246236 | 9/2004 |
| WO | WO 2004/074242 | 9/2004 |

OTHER PUBLICATIONS

International Search Report in connection with corresponding PCT application No. PCT/JP2006/309897, dated Jul. 25, 2006.

* cited by examiner

*Primary Examiner* — Cynthia Kelly
*Assistant Examiner* — Connie P Johnson
(74) *Attorney, Agent, or Firm* — Knobbe Martens Olson & Bear LLP

(57) ABSTRACT

The present invention provides a resist composition prepared by dissolving components in an organic solvent containing ethyl lactate, which suppresses deterioration of sensitivity with time and also has required lithographic characteristics, and a method for forming a resist pattern. The resist composition is prepared by dissolving a resin component (A) which exhibits changeable alkali solubility under an action of an acid, an acid generator component (B) which generates an acid upon exposure, an amine (D) and acetic acid in an organic solvent (S) containing ethyl lactate.

4 Claims, No Drawings

RESIST COMPOSITION AND RESIST PATTERN FORMING METHOD

RELATED APPLICATIONS

This application is the U.S. National Phase filing under 35 U.S.C. §371 of PCT/JP2006/309897, filed May 18, 2006, which designated the United States and was published in a language other than English, which claims priority under 35 U.S.C. §119(a)-(d) to Japanese Patent Application No. 2005-210064 filed Jul. 20, 2005. The content of these applications is incorporated herein by reference in their entireties.

TECHNICAL FIELD

The present invention relates to a resist composition and a method for forming a resist pattern.

Lithographic techniques include the steps of forming a resist film made of a resist material on a substrate, selectively exposing the resist film to radiation such as light or an electron beam through a mask with a predetermined pattern formed thereon, and developing the resist film to form a resist pattern having a predetermined shape on the resist film.

A resist material having characteristics which cause the exposed portions to become soluble in a developing solution is referred to as a positive resist material, whereas, a resist material having characteristics which cause the exposed portions to become insoluble in a developing solution is referred to as a negative resist material.

In recent years, in the production of semiconductor elements and liquid crystal display elements, advances in lithography techniques have lead to rapid progress in the field of miniaturization.

Typically, these miniaturization techniques involve shortening the wavelength of the exposure light source. Specifically, ultraviolet radiation such as g-line and i-line radiation has conventionally been used, but nowadays KrF excimer lasers and ArF excimer lasers have begun to be introduced in the mass production of semiconductor elements.

Also, radiation having a shorter wavelength than that of these excimer lasers, for example, $F_2$ excimer lasers, electron beams, EUV (extreme ultraviolet), and X-rays are also being examined.

It is required that the resist material has sensitivity to these exposure light sources, and lithographic characteristics such as resolution capable of reproducing a pattern of minute dimensions.

As the resist material which satisfies these requirements, a chemically amplified photoresist containing a base resin which exhibits changeable alkali solubility under an action of an acid, and an acid generator component which generates an acid upon exposure is used. For example, a positive chemically amplified photoresist contains, as the base resin, a resin which exhibits increased alkali solubility under an action of an acid and an acid generator and when an acid is generated from the acid generator upon exposure in the formation of a resist pattern, the exposed portions are changed to an alkali-soluble state.

As the base resin of the chemically amplified photoresist, polyhydroxystyrene (PHS) having high transparency to a KrF excimer laser (248 nm) and a resin (PHS-based resin) containing a hydroxyl group protected with an acid dissociable, dissolution inhibiting group have conventionally been used. However, the PHS-based resin contains an aromatic ring such as a benzene ring and is therefore insufficient in transparency to light having a wavelength shorter than 248 nm, for example, light having a wavelength of 193 nm (ArF excimer laser). Therefore, a chemically amplified photoresist containing the PHS-based resin as a base resin component has a drawback such as low resolution in a process using light having a wavelength of 193 nm.

Therefore, as the base resin used in ArF excimer laser lithography, a resin (acrylic resin) containing a structural unit derived from a (meth)acrylate ester in the main chain (see, for example, Patent Documents 1 and 2) is mainly used because it is excellent in transparency at around 193 nm.

Also, ethyl lactate is used as a solvent of the resist composition.

(Patent Document 1)
Japanese Patent No. 2881969 (Japanese Unexamined Patent Application, First Publication No. Hei 4-39665)
(Patent Document 2)
Japanese Unexamined Patent Application, First Publication No. 2003-241385

DISCLOSURE OF THE INVENTION

However, a resist composition prepared by dissolving components in an organic solvent containing ethyl lactate has a problem that deterioration of sensitivity with time of the resist composition is likely to occur. Therefore, an improvement in deterioration of sensitivity with time is required.

Even if deterioration of sensitivity with time is improved, there is a problem such as poor lithographic characteristics.

As the method of suppressing deterioration of sensitivity of the resist composition, a method of adding an organic base compound is employed. However, in the resist composition prepared by dissolving components in an organic solvent containing ethyl lactate, sufficient effect of suppressing deterioration of sensitivity with time of the resist composition cannot be exerted by the method of adding an organic base compound.

Under these circumstances, the present invention has been completed and an object thereof is to provide a resist composition prepared by dissolving components in an organic solvent containing ethyl lactate, which suppresses deterioration of sensitivity with time and also has required lithographic characteristics, and a method for forming a resist pattern.

In order to achieve the above object, the present inventors propose means shown below.

Namely, in a first aspect of the present invention, a resist composition includes an organic solvent (S) containing ethyl lactate, and a resin component (A) which exhibits changeable alkali solubility under an action of an acid, an acid generator component (B) which generates an acid upon exposure, an amine (D) and acetic acid, which are dissolved in the organic solvent.

In a second aspect of the present invention, a method for forming a resist pattern includes the steps of forming a resist film on a substrate using a resist composition of the first aspect; exposing the resist film; and developing the resist film to form a resist pattern.

In the claims and specification, "exposure" is used as a general concept which includes the entire irradiation of the radiation.

EFFECTS OF THE INVENTION

According to the present invention, it is possible to provide a resist composition prepared by dissolving components in an organic solvent containing ethyl lactate, which suppresses deterioration of sensitivity with time and also has required lithographic characteristics, and a method for forming a resist pattern.

BEST MODE FOR CARRYING OUT THE INVENTION

Resist Composition

The resist composition of the present invention is prepared by dissolving a resin component (A) which exhibits changeable alkali solubility under an action of an acid (hereinafter referred to as component (A)), an acid generator component (B) which generates an acid upon exposure (hereinafter referred to as component (B)), an amine (D) and acetic acid in an organic solvent (S) containing ethyl lactate (hereinafter referred to as a component (S)).

(Component (A))

There are no particular restrictions on the component (A) provided it is a resin component which exhibits changeable alkali solubility under an action of an acid, and it is possible to use one or more kinds of alkali-soluble resins or resins capable of becoming alkali-soluble, which have conventionally been proposed as a chemically amplified photoresist. The component is a negative resist composition in the former case and the component is a positive resist composition in the latter case.

In the case of the negative resist composition, the resist composition is mixed with a crosslinking agent, together with an alkali-soluble resin and the component (B). When an acid is generated from the component (B) upon exposure in the formation of a resist pattern, this acid causes crosslinking between the alkali-soluble resin and the crosslinking agent, causing the component (A) to become alkali-insoluble.

The alkali-soluble resin is preferably a resin containing a unit which is derived from at least one selected from an α-(hydroxyalkyl)acrylic acid and a lower alkyl ester of α-(hydroxyalkyl)acrylic acid because a favorable resist pattern with less swelling can be formed.

As the crosslinking agent, for example, an amino-based crosslinking agent such as glycoluryl having a methylol group or an alkoxymethyl group, particularly a methoxymethyl group or a butoxymethyl group is preferably used because a favorable resist pattern with less swelling can be formed. The amount of the crosslinking agent is preferably within a range from 1 to 50 parts by mass, based on 100 parts by mass of the alkali-soluble resin.

In the case of the positive resist composition, the component (A) is an alkali-insoluble component having an acid dissociable, dissolution inhibiting group and, when an acid is generated from the component (B) upon exposure, the acid causes the acid-dissociable, dissolution-inhibiting group to dissociate, causing the component (A) to change to an alkali-soluble state from an alkali-insoluble state.

Therefore, when the resist composition applied on a substrate is selectively exposed in the formation of a resist pattern, alkali-solubility of the exposed portions increases, thus making it possible to perform alkali development.

In the present invention, a positive resist composition is preferred.

Examples of the component (A) used preferably in the positive resist composition include a polyhydroxystyrene-based resin and an acrylate ester-based resin.

The resin components, which are preferably used, as the component (A) used preferably in a chemically amplified photoresist composition in lithography using a KrF excimer laser and ArF excimer a laser will now be described by way of examples.

The component (A) used preferably for a KrF excimer laser is preferably resin (A1)' including a structural unit derived from hydroxystyrene (a1)' and a structural unit (a2)' containing an acid dissociable, dissolution inhibiting group, for example, a copolymer including these structural units, and more preferably a resin (A1)' including the above structural units (a1)' and (a2)', and a structural unit (a3)' derived from styrene in view of the effect of the present invention. The resin (A1)' is preferably a copolymer.

Structural Unit (a1)'

A structural unit (a1)' is a structural unit derived from hydroxystyrene.

In the structural unit (a1)', the term "structural unit derived from hydroxystyrene" refers to a structural unit formed by cleavage of the ethylenic double bond of hydroxystyrene and a hydroxystyrene derivative (monomer).

Herein, the term "hydroxystyrene derivative" includes those in which at least a benzene ring and a hydroxyl group bonded thereto are maintained and, for example, the hydrogen atom bonded to the α-position of hydroxystyrene has been substituted with the another substituent such as a halogen atom, a lower alkyl group of 1 to 5 carbon atoms, or a halogenated alkyl group of 1 to 5 carbon atoms, those in which a lower alkyl group of 1 to 5 carbon atoms is further bonded to the benzene ring bonded with a hydroxyl group of hydroxystyrene, and those in which 1 or 2 hydroxyl groups are further bonded to the benzene ring bonded with a hydroxyl group (the total number of hydroxyl groups is from 2 to 3).

Examples of the halogen atom include a chlorine atom, a fluorine atom, and a bromine atom, of which a fluorine atom is preferred.

The term "the α-position of hydroxystyrene", unless stated otherwise, means a carbon atom to which a benzene ring is bonded.

The structural unit included in the structural unit (a1)' is preferably a structural unit (a11)' represented by general formula (a1-1)' shown below:

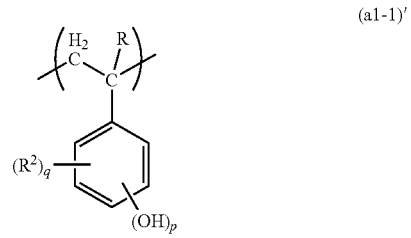

(a1-1)'

(wherein R represents a hydrogen atom, an alkyl group, a halogen atom, or a halogenated alkyl group; $R^2$ represents a lower alkyl group of 1 to 5 carbon atoms; p represents an integer from 1 to 3; and q represents an integer of 0, 1 or 2).

The alkyl group as R preferably represents a lower alkyl group and is an alkyl group of 1 to 5 carbon atoms. Also, a straight-chain or branched-chain alkyl group is preferred, and examples include a methyl group, an ethyl group, a propyl group, an isopropyl group, an n-butyl group, an isobutyl group, a tert-butyl group, a pentyl group, an isopentyl group, and a neopentyl group. Of these alkyl groups, a methyl group is preferred industrially.

Examples of the halogen atom include a fluorine atom, a chlorine atom, a bromine atom, and an iodine atom, of which a fluorine atom is preferred.

The halogenated alkyl group is preferably a halogenated lower alkyl group in which either a portion of, or all of, the hydrogen atoms of the lower alkyl group of 1 to 5 carbon atoms have been substituted with halogen atoms. It is preferred that all of the hydrogen atoms are fluorinated.

The halogenated lower alkyl group is preferably a straight-chain or branched-chain fluorinated lower alkyl group, more preferably a trifluoromethyl group, a hexafluoroethyl group, a heptafluoropropyl group, or a nonafluorobutyl group, and most preferably a trifluoromethyl group ($-CF_3$).

R is preferably a hydrogen atom or a methyl group, and more preferably a hydrogen atom.

Examples of the lower alkyl group of 1 to 5 carbon atoms as $R^2$ include the same lower alkyl group represented by R.

q represents an integer of 0, 1 or 2. q preferably represents 0 or 1, and particularly preferably 0 industrially.

When q is 1, the substitution position of $R^2$ may be the o-, m- or p-position. Furthermore, when q is 2, optional substitution positions can be used in combination.

p represents an integer from 1 to 3, and preferably 1.

When p is 1, the substitution position of the hydroxyl group substitution position may be the o-, m- or p-position, of which the p-position is preferred for reasons such as industrial availability and low cost. Furthermore, when p is 2 or 3, optional substitution positions can be used in combination.

The structural unit (a1)' may be used alone, or a combination of two or more different structural units may be used.

In the resin (A1)' the proportion of the structural unit (a1)' in the resin (A1)' is preferably from 20 to 80 mol %, more preferably from 25 to 70 mol %, still more preferably from 30 to 65 mol %, and most preferably from 45 to 65 mol %. Ensuring that the proportion is within the above ranges enables a suitable level of alkali solubility to be obtained, and enables a good balance to be achieved with the other structural units.

Structural Unit (a2)'

The structural unit (a2)' is a structural unit containing an acid dissociable, dissolution inhibiting groups.

Examples of the structural unit included in the structural unit (a2)' are preferably a structural unit (a21)' represented by general formula (a2-1)' shown below and a structural unit (a22)' represented by general formula (a2-2)' shown below:

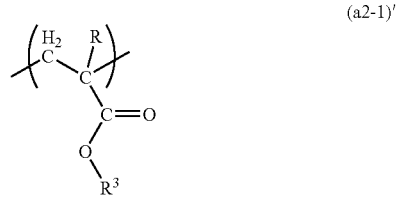

(a2-1)'

(wherein R represents a hydrogen atom, an alkyl group, a halogen atom, or a halogenated alkyl group; and $R^3$ represents an acid dissociable, dissolution inhibiting group), and

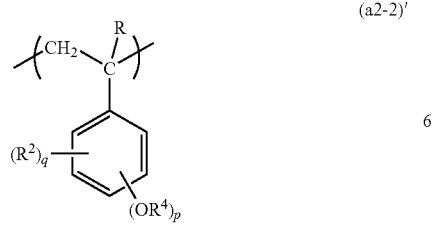

(a2-2)'

(wherein R represents a hydrogen atom, an alkyl group, a halogen atom, or a halogenated alkyl group; $R^2$ represents a lower alkyl group of 1 to 5 carbon atoms; p represents an integer from 1 to 3; q represents an integer of 0, 1 or 2; and $R^4$ represents an acid dissociable, dissolution inhibiting group).

In general formulas (a2-1)' and (a2-2)', $R^3$ and $R^4$ each represents, independently, an acid dissociable, dissolution inhibiting group.

The acid dissociable, dissolution inhibiting group can be selected appropriately from the multitude of groups that have been proposed for the resins of resist compositions designed for use with KrF and ArF excimer lasers. Examples of the acid dissociable, dissolution inhibiting group are preferably a chain tertiary alkoxycarbonyl group, a chain tertiary alkoxycarbonylalkyl group, and a chain or cyclic tertiary alkyl group.

The chain tertiary alkoxycarbonyl group is preferably a chain tertiary alkoxycarbonyl group of 4 to 10 carbon atoms, and more preferably 4 to 8 carbon atoms. Specific examples of the chain tertiary alkoxycarbonyl group include a tert-butoxycarbonyl group and a tert-amyloxycarbonyl group.

The chain tertiary alkoxycarbonylalkyl group is preferably a chain tertiary alkoxycarbonylalkyl group of 4 to 10 carbon atoms, and more preferably 4 to 8 carbon atoms. Specific examples of the chain tertiary alkoxycarbonylalkyl group include a tert-butoxycarbonylmethyl group and a tert-amyloxycarbonylmethyl group.

The chain tertiary alkyl group is preferably a chain tertiary alkyl group of 4 to 10 carbon atoms, and more preferably 4 to 8 carbon atoms. Specific examples of the chain tertiary alkyl group include a tert-butyl group and a tert-amyl group.

The cyclic tertiary alkyl group is a monocyclic or polycyclic monovalent saturated hydrocarbon group containing a tertiary carbon atom on the ring. Specific examples of the cyclic tertiary alkyl group include a 1-methylcyclopentyl group, a 1-ethylcyclopentyl group, a 1-methylcyclohexyl group, a 1-ethylcyclohexyl group, a 2-methyl-2-adamantyl group, and a 2-ethyl-2-adamantyl group.

The heat resistance is improved by including, as the acid dissociable, dissolution inhibiting group, a chain tertiary alkoxycarbonyl group, a chain tertiary alkoxycarbonylalkyl group, or a chain or cyclic tertiary alkyl group.

Of these acid dissociable, dissolution inhibiting group, a chain tertiary alkyl group is preferred in view of resolution, and a tert-butyl group is particularly preferred.

In the present invention, the acid dissociable, dissolution inhibiting group preferably includes an acid dissociable, dissolution inhibiting group represented by general formula (I)' shown below:

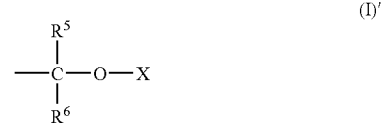

(I)'

(wherein X represents an aliphatic cyclic group, an aromatic cyclic hydrocarbon group or a lower alkyl group; $R^5$ represents a hydrogen atom or a lower alkyl group, or X and $R^5$ each represents, independently, an alkylene group of 1 to 5 carbon atoms and the terminal of X may be bonded to the terminal of $R^5$; and $R^6$ represents a hydrogen atom or a lower alkyl group).

In the claims and specification, the term "aliphatic" is a relative concept used in relation to the term "aromatic", and defines a group or compound that contains no aromaticity.

The term "aliphatic cyclic group" describes a monocyclic group or polycyclic group that contains no aromaticity, and may be either saturated or unsaturated, but is preferably saturated.

The aliphatic cyclic group as X is a monovalent aliphatic cyclic group. The aliphatic cyclic group can be selected appropriately from the multitude of groups that have been proposed for KrF and ArF resists.

Specific examples of the aliphatic cyclic group include an aliphatic monocyclic group of 5 to 7 carbon atoms and an aliphatic polycyclic group of 7 to 16 carbon atoms.

The aliphatic monocyclic group of 5 to 7 carbon atoms is a group in which one hydrogen atom has been removed from a monocycloalkane, and specific examples include groups in which one hydrogen atom has been removed from cyclopentane or cyclohexane.

The aliphatic polycyclic group of 7 to 16 carbon atoms is a group in which one hydrogen atom has been removed from a bicycloalkane, a tricycloalkane, or a tetracycloalkane, and specific examples include groups in which one hydrogen atom has been removed from a polycycloalkane such as adamantane, norbornane, isobornane, tricyclodecane, or tetracyclododecane. Of these aliphatic polycyclic groups, an adamantyl group, a norbornyl group, and a tetracyclododecanyl group are preferred industrially, and an adamantyl group is particularly preferred.

Examples of the aromatic cyclic hydrocarbon group as X include an aromatic polycyclic group of 10 to 16 carbon atoms. Specific examples include groups in which one hydrogen atom has been removed from naphthalene, anthracene, phenanthrene, or pyrene. More specific examples include a 1-naphthyl group, a 2-naphthyl group, a 1-anthracenyl group, a 2-anthracenyl group, a 1-phenantolyl group, a 2-phenantolyl group, a 3-phenantolyl group, and a 1-pyrenyl group, of which a 2-naphthyl group is preferred industrially.

Examples of the lower alkyl group as X include the same lower alkyl group as R in formula (a1-1)' shown above.

X is preferably a lower alkyl group, more preferably a methyl group or an ethyl group, and most preferably an ethyl group.

Examples of the lower alkyl group as $R^5$ include the same lower alkyl groups as R in formula (a1-1)' shown above. A methyl group or an ethyl group is preferred industrially, and a methyl group is particularly preferred.

$R^6$ represents a lower alkyl group or a hydrogen atom. Examples of the lower alkyl group as $R^6$ include the same lower alkyl groups as $R^5$. $R^6$ is preferably a hydrogen atom, industrially.

In formula (I)', X and $R^5$ each represents, independently, an alkylene group of 1 to 5 carbon atoms and the terminal of X may be bonded to the terminal of $R^5$.

In this case, in formula (I)', a cyclic group is formed by $R^5$, X, an oxygen atom bonded with X, and a carbon atom bonded with the oxygen atom and $R^5$.

The cyclic group is preferably a 4- to 7-membered ring, and more preferably a 4- to 6-membered ring. Specific examples of the cyclic group include a tetrahydropyranyl group and a tetrahydrofuranyl group.

The acid dissociable, dissolution inhibiting group (I)' is preferably a group in which $R^6$ is a hydrogen atom in terms of achieving excellent effects for the present invention.

Specific examples include groups in which X is an alkyl group, namely, a 1-alkoxyalkyl group such as a 1-methoxyethyl group, a 1-ethoxyethyl group, a 1-iso-propoxyethyl group, a 1-n-butoxyethyl group, a 1-tert-butoxyethyl group, a methoxymethyl group, an ethoxymethyl group, an iso-propoxymethyl group, a n-butoxymethyl group, or a tert-butoxymethyl group.

Examples of the group in which X is an aliphatic cyclic group include a 1-cyclohexyloxyethyl group, a (2-adamantyl)oxymethyl group, and a 1-(1-adamantyl)oxyethyl group represented by formula (II-a) shown below.

Examples of the group in which X is an aromatic cyclic hydrocarbon group include a 1-(2-naphthyl)oxyethyl group represented by formula (II-b) shown below.

Of these groups, a 1-ethoxyethyl group is particularly preferred.

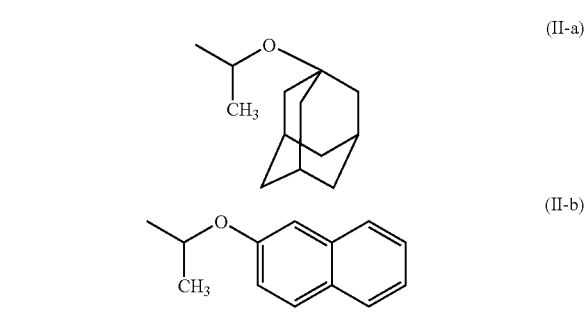

As the acid dissociable, dissolution inhibiting group in the present invention, at least one kind selected from the group consisting of a chain tertiary alkoxycarbonyl group, a chain tertiary alkoxycarbonylalkyl group, a chain or cyclic tertiary alkyl group, and a group of general formula (I)' shown above is preferably used.

Of these acid dissociable, dissolution inhibiting group, a group of general formula (I)' is more preferred, and it is most preferred that a group of general formula (I)' shown above is contained as a main component.

The term "contained as a main component" means that the content of the group accounts for 50 mol % or more, preferably 70 mol % or more, and more preferably 80 mol % or more of the acid dissociable, dissolution inhibiting group contained in the resin (A1)'.

Examples of R in the structural units (a21)' and (a22)' include the same R as in general formula (a1-1)' shown above.

Examples of $R^2$ in the structural unit (a22) include the same $R^2$ in general formula (a1-1)'.

Also, examples of p and q in structural unit (a22)' include the same p and q as in general formula (a1-1)' shown above.

The structural unit (a2)' may be used alone, or a combination of two or more different structural units may be used.

The proportion of the structural unit (a2)' in the resin (A1)', relative to the combined total of all the structural units that constitute the resin (A1), is preferably within a range from 5 to 70 mol %, more preferably from 5 to 65 mol %, still more preferably from 5 to 60 mol %, and most preferably from 5 to 55 mol %. Ensuring that this proportion is at least as large as the lower limit of the above ranges enables a favorable resist pattern to be obtained when the component is used in a resist composition, whereas ensuring that the proportion is no greater than the upper limits enables a balance to be achieved with the other structural units.

Also, when the structural unit (a2)' is the structural unit (a21)', the proportion of the structural unit (a2)' in the resin (A1)', relative to the combined total of all the structural units that constitute the resin (A1)', is preferably within a range from 5 to 70 mol %, more preferably from 5 to 50 mol %, still more preferably from 10 to 45 mol %, and most preferably from 10 to 35 mol %. Ensuring that this proportion is at least as large as the lower limits of the above ranges enables a favorable resist pattern to be obtained when the component is used in a resist composition, whereas ensuring that the proportion is no greater than the upper limits enables a balance to be achieved with the other structural units.

Also, when the structural unit (a2)' is the structural unit (a22)', the proportion of the structural unit (a2)' in the resin (A1)', relative to the combined total of all the structural units that constitute the resin (A1)', is preferably within a range from 5 to 70 mol %, more preferably from 10 to 65 mol %, still more preferably from 20 to 60 mol %, and most preferably from 30 to 55 mol %. Ensuring that this proportion is at least as large as the lower limits of the above ranges enables a favorable resist pattern to be obtained when the component is used in a resist composition, whereas ensuring that the proportion is no greater than the upper limits enables a balance to be achieved with the other structural units.

Structural Unit (a3)'

The resin (A1)' may further contain a structural unit (a3)' derived from styrene. Although the structural unit (a3)' is not essential, heat resistance of the resulting resist composition can be improved when mixed.

The term "structural unit derived from styrene" in the structural unit (a3)' includes a structural unit formed by cleavage of the ethylenic double bond of styrene and a styrene derivative (which does not include hydroxystyrene).

Herein, the term "styrene derivative" includes those in which the hydrogen atom bonded to the α-position of styrene has been substituted with another substituent such as a halogen atom, an alkyl group, or a halogenated alkyl group, and those in which the hydrogen atom of a phenyl group of styrene is substituted with a substituent such as a lower alkyl group of 1 to 5 carbon atoms.

Examples of the halogen atom include a chlorine atom, a fluorine atom, and a bromine atom, of which a fluorine atom is preferred. The number of carbon atoms of the alkyl group and the halogenated alkyl group is preferably from 1 to 5.

The term "the α-position of styrene", unless stated otherwise, means a carbon atom to which a benzene ring is bonded.

The structural unit included in the structural unit (a3)' is preferably a structural unit (a31)' represented by general formula (a3-1)' shown below:

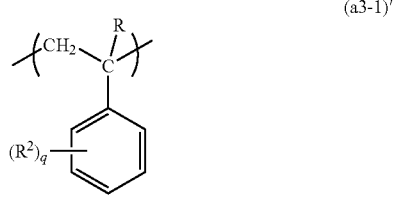

(a3-1)'

(wherein R represents a hydrogen atom, an alkyl group, a halogen atom, or a halogenated alkyl group; $R^2$ represents a lower alkyl group of 1 to 5 carbon atoms; and q represents an integer of 0, 1 or 2).

Examples of R and $R^2$ include the same R and $R^2$ as in general formula (a1-1)'.

q represents an integer of 0, 1 or 2. q is preferably 0 or 1, and particularly preferably 0 industrially.

When q is 1, the substitution position of $R^2$ may be the o-, m- or p-position. Furthermore, when q is 2, optional substitution positions can be used in combination.

The structural unit (a3)' may be used alone, or a combination of two or more different structural units may be used.

When the resin (A1)' contains a structural unit (a3)', the proportion of the structural unit (a3)' in the resin (A1)' is preferably from 1 to 25 mol %, more preferably from 5 to 25 mol %, and most preferably from 5 to 20 mol %. Ensuring that the proportion is within the above range enables enhanced heat resistance effect when a resist composition is prepared, and a good balance to be achieved with the other structural units.

The resin (A1)' may also include another structural unit besides the essential structural units (a1)' and (a2)' and the structural unit (a3)' contained preferably, provided the inclusion of this other unit does not impair the effects of the present invention.

As the structural unit, any other structural unit that cannot be classified as one of the essential structural units (a1), and (a2)' and the structural unit (a3)' contained preferably can be used without any particular restrictions, and any of the multitude of conventional structural units used in resist resins for KrF excimer lasers or ArF excimer lasers can be used.

The resin (A1)' is particularly preferably a copolymer (A11-1-1) composed of a combination of structural units shown below:

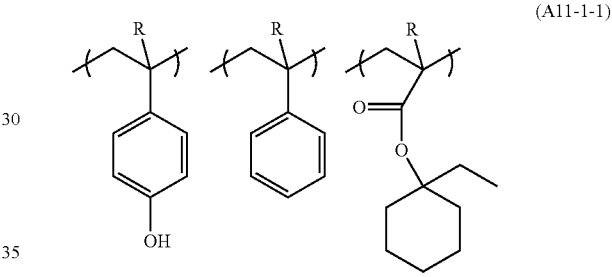

(A11-1-1)

(wherein R is as defined above).

The copolymer (A1)' can be obtained by polymerizing a monomer, from which each structural unit is derived, by known radical polymerization using a radical polymerization initiator such as azobisisobutyronitrile (AIBN).

Also, a —C(CF$_3$)$_2$—OH group may be introduced into the copolymer (A1)' using in combination with a chain transfer agent such as HS—CH$_2$—CH$_2$—CH$_2$—C(CF$_3$)$_2$—OH upon the above polymerization. The copolymer containing a hydroxyalkyl, in which a portion of hydrogen atoms of an alkyl group have been substituted with a fluorine atom, introduced therein is effective to reduce developing defects and to decrease LER (line edge roughness: heterogeneous irregularity of line side wall).

There are no particular restrictions on the weight average molecular weight (Mw) (the polystyrene equivalent weight average molecular weight determined by gel permeation chromatography) of the resin (A1)', and the weight average molecular weight is preferably within a range from 2,000 to 50,000, more preferably from 3,000 to 30,000, and most preferably from 5,000 to 20,000. Ensuring that the weight average molecular weight is smaller than the upper limits of the above ranges enables sufficient solubility in a resist solvent, which is suited for use as a resist, whereas ensuring that the weight average molecular weight is greater than the lower limits of the above ranges enables excellent dry etching resistance and resist pattern profile.

The dispersion degree (Mw/Mn) is preferably from 1.0 to 5.0, more preferably from 1.0 to 3.0, and most preferably from 1.2 to 2.5.

In the component (A)', these copolymers (A1)' can be used either alone, or in combinations of two or more different copolymers.

Also, the component (A)' may be mixed with a resin component other than the copolymer (A1)'.

The amount of the copolymer (A1)' in the component (A)' is preferably 70% by mass or more, more preferably 80% by mass or more, and most preferably 100% by mass.

The component (A) used preferably for ArF excimer lasers will now be described.

The component (A) preferably contains a copolymer (A1) which contains a structural unit (a1) derived from an acrylate ester containing an acid dissociable, dissolution inhibiting group, and a structural unit (a2) derived from an acrylate ester containing a lactone-containing cyclic group.

Furthermore, the copolymer (A1) preferably contains a structural unit (a3) derived from an acrylate ester containing a polar group-containing aliphatic hydrocarbon group.

Also, the component (A) may contain a resin other than the copolymer (A1) or may be composed of the copolymer (A1). The content of the copolymer (A1) in the component (A) is preferably 50% by mass or more, more preferably from 80 to 100% by mass, and most preferably 100% by mass. These copolymers (A1) can be used either alone, or in combinations of two or more different copolymers.

In the specification, the term "structural unit derived from an acrylate ester" refers to a structural unit formed by cleavage of the ethylenic double bond of an acrylate ester.

"Acrylate ester" is used as a general concept which includes an acrylate ester in which a substituent (an atom or a group other than a hydrogen atom) is bonded to the α-position carbon atom besides an acrylate ester in which a hydrogen atom is bonded to the α-position carbon atom. Examples of the substituent include a halogen atom, a lower alkyl group, and a halogenated lower alkyl group. Examples of the halogen atom include a fluorine atom, a chlorine atom, a bromine atom, and an iodine atom, of which a fluorine atom is preferred.

Unless stated otherwise, the term "α-position (α-position carbon atom) of a structural unit derived from an acrylate ester" refers to the carbon atom to which the carbonyl group is bonded.

The "alkyl group", unless stated otherwise, includes straight-chain, branched-chain, and cyclic monovalent saturated hydrocarbon groups.

A "lower alkyl group" is an alkyl group of 1 to 5 carbon atoms.

In the acrylate ester, specific examples of the lower alkyl group as the α-position substituent include lower straight-chain or branched-chain alkyl groups such as a methyl group, an ethyl group, a propyl group, an isopropyl group, an n-butyl group, an isobutyl group, a tert-butyl group, a pentyl group, an isopentyl group, and a neopentyl group.

The substituent bonded to the acrylate ester at the α-position is preferably a hydrogen atom, a halogen atom, a lower alkyl group, or a halogenated lower alkyl group, more preferably a hydrogen atom, a fluorine atom, a lower alkyl group, or a fluorinated lower alkyl group, still more preferably a hydrogen atom or a methyl group for reasons such as industrial availability, and most preferably a hydrogen atom.

Structural Unit (a1)

The structural unit (a1) is a structural unit derived from an acrylate ester containing acid dissociable, dissolution inhibiting groups.

The acid-dissociable, dissolution-inhibiting group in the structural unit (a1) can use any of the groups that have been proposed as acid-dissociable, dissolution-inhibiting groups for the base resins of chemically amplified resists, provided the group has an alkali dissolution-inhibiting effect that renders the entire copolymer (A1) alkali-insoluble prior to dissolution, and then following dissociation, causes the entire copolymer (A1) to change to an alkali-soluble state. Generally, groups that form either a cyclic or chain-like tertiary alkyl ester, or form a cyclic or a chain-like alkoxyalkyl ester group with the carboxyl group of (meth)acrylic acid are the most widely known. The term "(meth)acrylate ester" is a generic term that includes either one of, or both, an acrylate ester with a hydrogen atom bonded at the α-position and a methacrylate ester with a methyl group bonded at the α-position.

Here, a "tertiary alkyl ester" describes a structure in which an ester is formed by substituting the hydrogen atom of the carboxyl group with an alkyl group or a cycloalkyl group, and the tertiary carbon atom of the alkyl group or a cycloalkyl group is bonded to the oxygen atom at the terminal of the carbonyloxy group (—C(O)—O—) of the ester. In this tertiary alkyl ester, the action of acid causes cleavage of the bond between the oxygen atom and the tertiary carbon atom.

The alkyl group or a cycloalkyl group may include a substituent.

The group that forms the tertiary alkyl ester with the carboxyl group, thereby exhibiting acid dissociability, is referred to as a "tertiary alkyl ester type acid dissociable, dissolution inhibiting group" for convenience sake.

A "cyclic or chain-like alkoxyalkyl ester" describes a structure in which an ester is formed by substituting the hydrogen atom of the carboxyl group with an alkoxyalkyl group, and the alkoxyalkyl group is bonded to the oxygen atom at the terminal of the carbonyloxy group (—C(O)—O—) of the ester. In this alkoxyalkyl ester, the action of acid causes cleavage of the bond between the oxygen atom and the alkoxyalkyl group.

The structural unit (a1) is preferably at least one unit selected from the group consisting of structural units represented by general formulas (a1-0-1) and (a1-0-2) shown below:

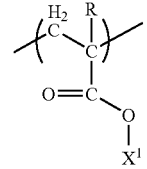

(a1-0-1)

(wherein R represents a hydrogen atom, a halogen atom, a lower alkyl group, or a halogenated lower alkyl group; and $X^1$ represents an acid dissociable, dissolution inhibiting group), and

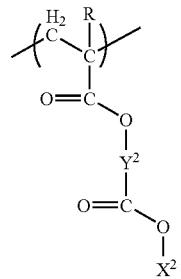

(a1-0-2)

(wherein R represents a hydrogen atom, a halogen atom, a lower alkyl group, or a halogenated lower alkyl group; $X^2$ represents an acid dissociable, dissolution inhibiting group; and $Y^2$ represents an alkylene group or aliphatic cyclic group).

In general formula (a1-0-1), the halogen atom, the lower alkyl group, or the halogenated lower alkyl group represented by R is the same as the halogen atom, the lower alkyl group or the halogenated lower alkyl group which may be bonded to the acrylate ester at the α-position.

There are no particular restrictions on $X^1$, provided that it is an acid dissociable, dissolution inhibiting group, and includes, for example, alkoxyalkyl group type and tertiary alkyl ester type acid dissociable, dissolution inhibiting groups, although a tertiary alkyl ester type acid dissociable, dissolution inhibiting group is preferable. Examples of the tertiary alkyl ester type acid dissociable, dissolution inhibiting group include an aliphatic branched-chain acid dissociable, dissolution inhibiting group and an acid dissociable, dissolution inhibiting group containing an aliphatic cyclic group.

In the claims and specification, the term "aliphatic" is a relative concept used in relation to the term "aromatic", and defines a group or compound or the like that contains no aromaticity.

The term "aliphatic cyclic group" describes a monocyclic group or polycyclic group that contains no aromaticity.

An "aliphatic cyclic group" in the structural unit (a1) may include a substituent. Examples of the substituent include a lower alkyl group of 1 to 5 carbon atoms, a fluorine atom, a fluorinated lower alkyl group of 1 to 5 carbon atoms substituted with a fluorine atom, or an oxygen atom (=O).

Although the "aliphatic cyclic group" having a basic ring structure in which the substituent has been removed need not necessarily be a group formed solely from carbon and hydrogen (namely, a hydrocarbon group), a hydrocarbon group is preferred. Furthermore, the "hydrocarbon group" may be either saturated or unsaturated, but is preferably saturated. A polycyclic group is particularly preferred.

Specific examples of this type of aliphatic cyclic group include groups in which one or more hydrogen atoms have been removed from a polycycloalkane such as a monocycloalkane, bicycloalkane, tricycloalkane or tetracycloalkane, which may be substituted with a lower alkyl group, a fluorine atom, or a fluorinated alkyl group. Specific examples of suitable groups include groups in which one or more hydrogen atoms have been removed from a monocycloalkane such as cyclopentane or cyclohexane, or a polycycloalkane such as adamantane, norbornane, isobornane, tricyclodecane or tetracyclododecane.

Specific examples of the aliphatic branched-chain acid dissociable, dissolution inhibiting group include a tert-butyl group and a tert-amyl group.

The acid dissociable, dissolution inhibiting group containing an aliphatic cyclic group includes, for example, a group containing a tertiary carbon atom on a ring skeleton of a cycloalkyl group, and specific examples include a 2-methyl-2-adamantyl group and a 2-ethyl-2-adamantyl group. Alternately, like a structural unit represented by the general formula shown below, examples include a group containing an aliphatic cyclic group such as an adamantyl group, and a branched-chain alkylene group containing a tertiary carbon atom bonded thereto.

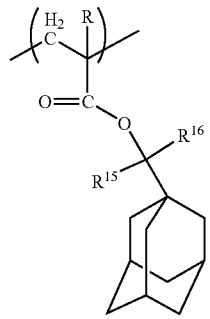

(wherein R is as defined above, and $R^{15}$ and $R^{16}$ represent an alkyl group (may be either straight-chain or branched-chain, and is preferably a group of 1 to 5 carbon atoms)

The alkoxyalkyl group is preferably a group represented by the general formula shown below.

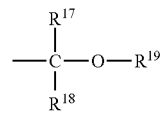

(wherein $R^{17}$ and $R^{18}$ each represents, independently, a straight-chain or branched-chain alkyl group, or a hydrogen atom, and $R^{19}$ represents a straight-chain or branched-chain alkyl group or cycloalkyl group, or the terminal of $R^{17}$ may be bonded to the terminal of $R^{19}$, thereby forming a ring)

In $R^{17}$ and $R^{18}$, the straight-chain or branched-chain alkyl group is preferably a group of 1 to 15 carbon atoms and may be either straight-chain or branched-chain, although an ethyl group and a methyl group are preferable, and a methyl group is most preferable.

It is particularly preferred that one of $R^{17}$ and $R^{18}$ is a hydrogen atom and the other is a methyl group.

$R^{19}$ is a straight-chain or branched-chain alkyl group or cycloalkyl group and is preferably a group of 1 to 15 carbon atoms, and may be a straight-chain, branched-chain, or cyclic group.

When $R^{19}$ is a straight-chain or branched-chain group, it is preferably a group of 1 to 5 carbon atoms, although an ethyl group and a methyl group are more preferable, and an ethyl group is most preferable.

When $R^{19}$ is a cyclic group, it is preferably a group of 4 to 15 carbon atoms, more preferably 4 to 12 carbon atoms, and most preferably 5 to 10 carbon atoms. Specific examples of this type of cyclic group include groups in which one or more hydrogen atoms have been removed from a polycycloalkane such as a monocycloalkane, bicycloalkane, tricycloalkane or tetracycloalkane, which may be substituted with a fluorine atom or a fluorinated alkyl group. Specific examples of suitable groups include groups in which one or more hydrogen atoms have been removed from a monocycloalkane such as cyclopentane or cyclohexane, or a polycycloalkane such as adamantane, norbornane, isobornane, tricyclodecane or tetracyclododecane. Of these groups, a group in which one or more hydrogen atoms have been removed from adamantane is preferable.

In the formula shown above, $R^{17}$ and $R^{19}$ each represents, independently, an alkylene group of 1 to 5 carbon atoms and the terminal of $R^{19}$ may be bonded to the terminal of $R^{17}$.

In this case, a cyclic group is formed by $R^{17}$ and $R^{19}$, the oxygen atom to which $R^{19}$ is bonded, and the carbon atom to which the oxygen atom and $R^{17}$ are bonded. The cyclic ring is preferably a 4- to 7-membered ring, and more preferably a 4- to 6-membered ring. Specific examples of the cyclic group include a tetrahydropyranyl group and a tetrahydrofuranyl group.

In general formula (a1-0-2), R is as defined above. $X^2$ is the same as $X^1$ in formula (a1-0-1)

$Y^2$ is preferably an alkylene group of 1 to 4 carbon atoms or a divalent aliphatic cyclic group.

Since $Y^2$ is a divalent aliphatic cyclic group, except for the case of using a group in which two or more hydrogen atoms have been removed, the same groups as those exemplified above in relation to the "aliphatic cyclic group" in the structural unit (a1) can be used.

More specifically, the structural unit (a1) includes structural units represented by general formulas (a1-1) to (a1-4):

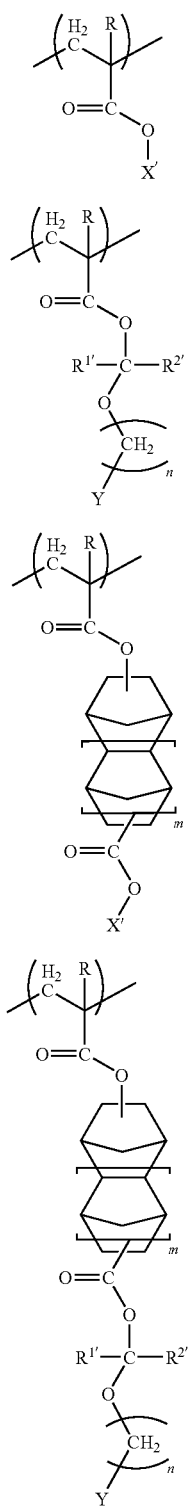

(wherein $X^1$ represents a tertiary alkyl ester type acid dissociable, dissolution inhibiting group; Y represents a lower alkyl group of 1 to 5 carbon atoms, or an aliphatic cyclic group; n represents either 0 or an integer from 1 to 3; m represents 0 or 1; R is as defined above; and $R^{1\prime}$ and $R^{2\prime}$ each represents, independently, a hydrogen atom or a lower alkyl group of 1 to 5 carbon atoms).

At least one of $R^{1\prime}$ and $R^{2\prime}$ is preferably a hydrogen atom, and more preferably both are hydrogen atoms. N is preferably either 0 or 1.

Examples of X' include the same tertiary alkyl ester type acid dissociable, dissolution inhibiting groups as those exemplified above in relation to the group $X^1$.

Examples of the aliphatic cyclic group represented by Y include the same groups as those exemplified in the description of the "aliphatic cyclic group".

Specific examples of the structural units represented by general formulas (a1-1) to (a1-4) are shown below.

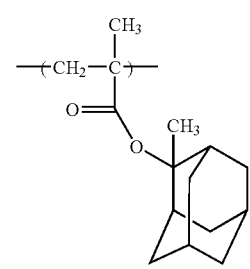

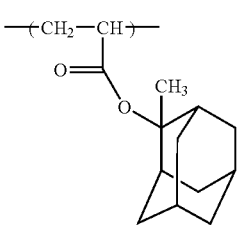

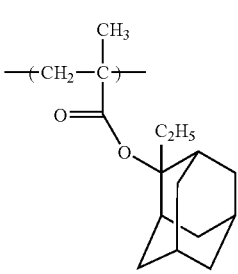

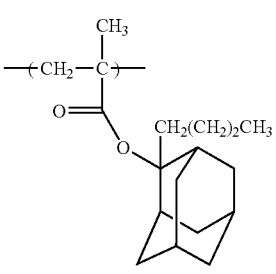

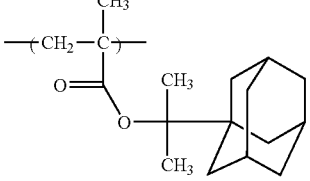

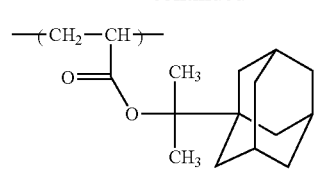
(a1-1-6)
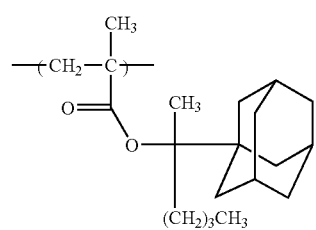
(a1-1-7)
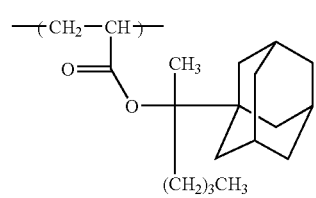
(a1-1-8)
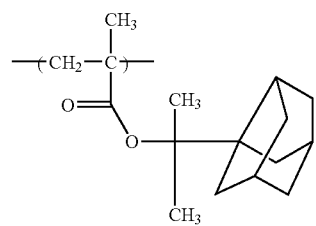
(a1-1-9)
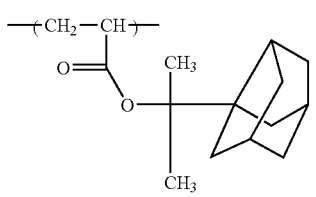
(a1-1-10)
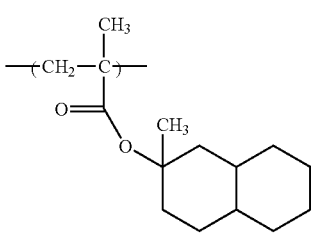
(a1-1-11)
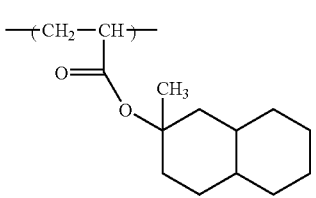
(a1-1-12)
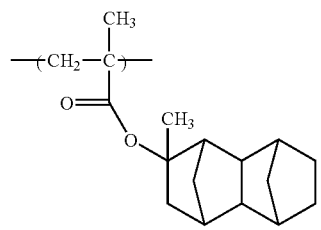
(a1-1-13)
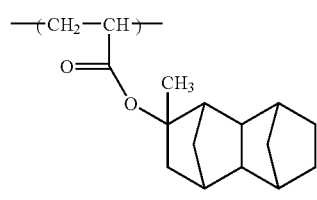
(a1-1-14)
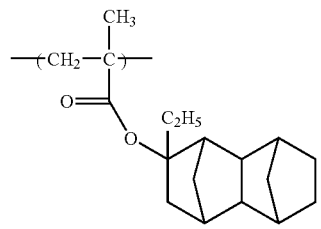
(a1-1-15)
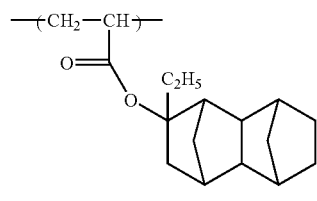
(a1-1-16)
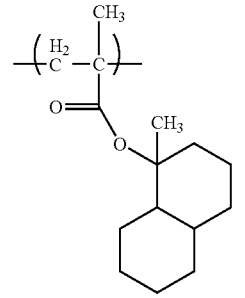
(a1-1-17)
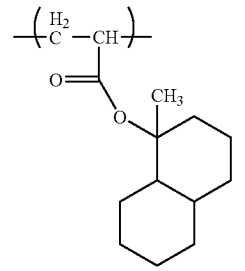
(a1-1-18)
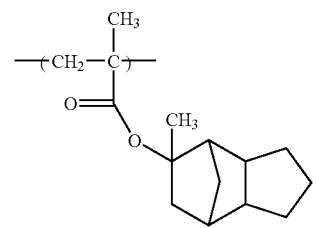
(a1-1-19)

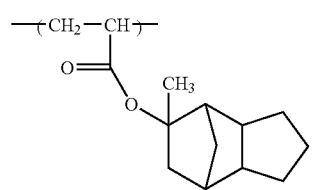 (a1-1-20)
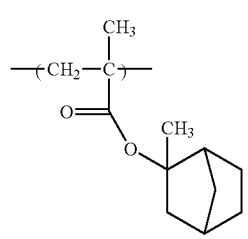 (a1-1-21)
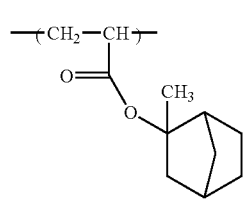 (a1-1-22)
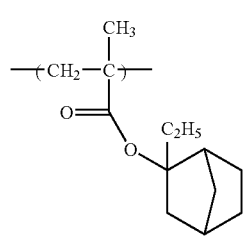 (a1-1-23)
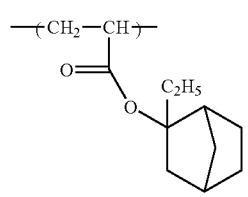 (a1-1-24)
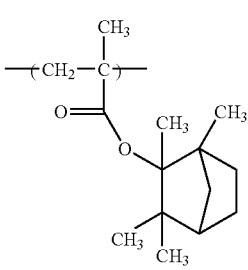 (a1-1-25)
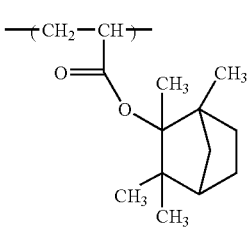 (a1-1-26)
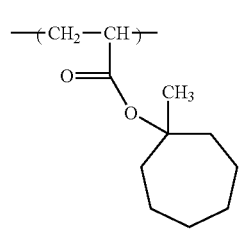 (a1-1-27)
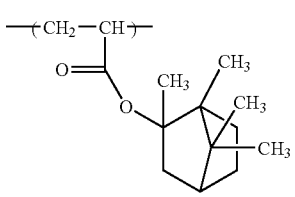 (a1-1-28)
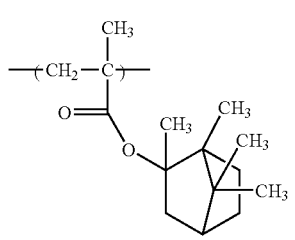 (a1-1-29)
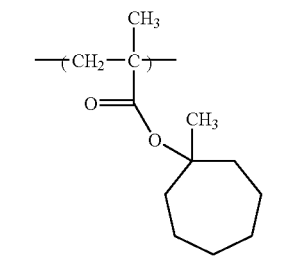 (a1-1-30)
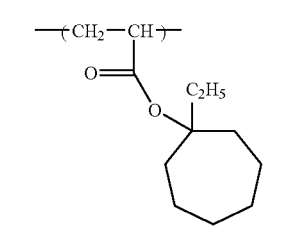 (a1-1-31)
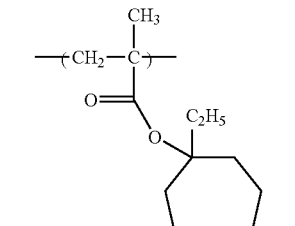 (a1-1-32)
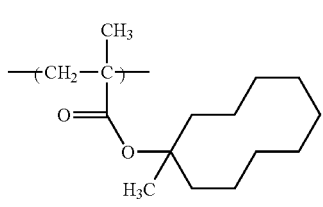 (a1-1-33)

(a1-1-34) 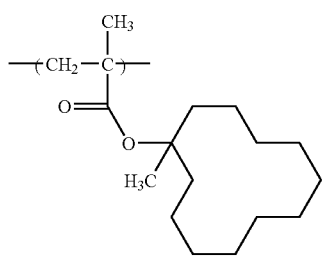
(a1-1-35) 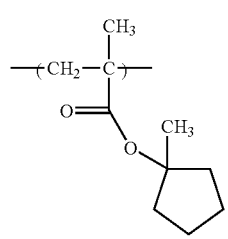
(a1-1-36) 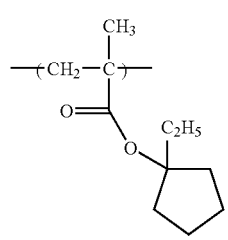
(a1-1-37) 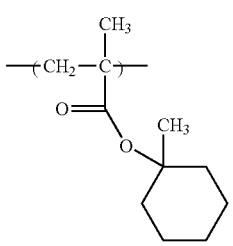
(a1-1-38) 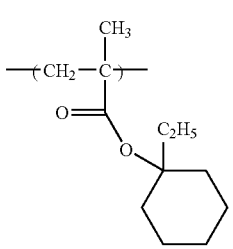
(a1-1-39) 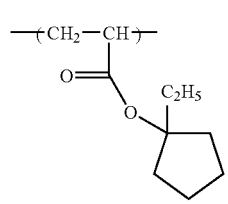
(a1-1-40) 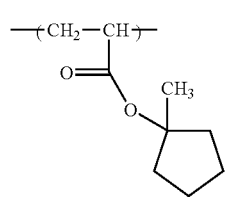
(a1-1-41) 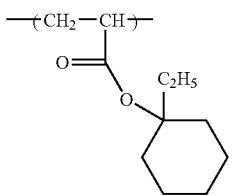
(a1-2-1) 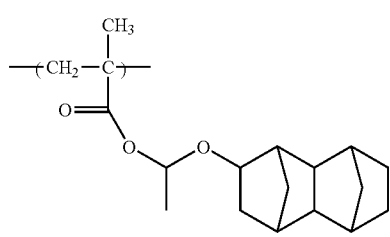
(a1-2-2) 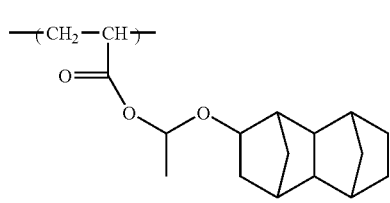
(a1-2-3) 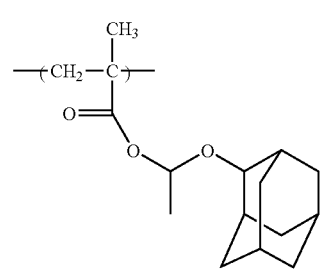
(a1-2-4) 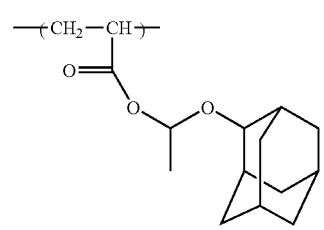
(a1-2-5) 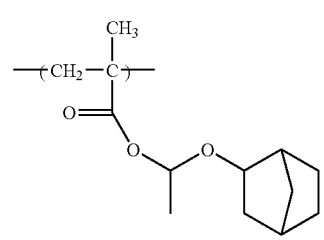
(a1-2-6)

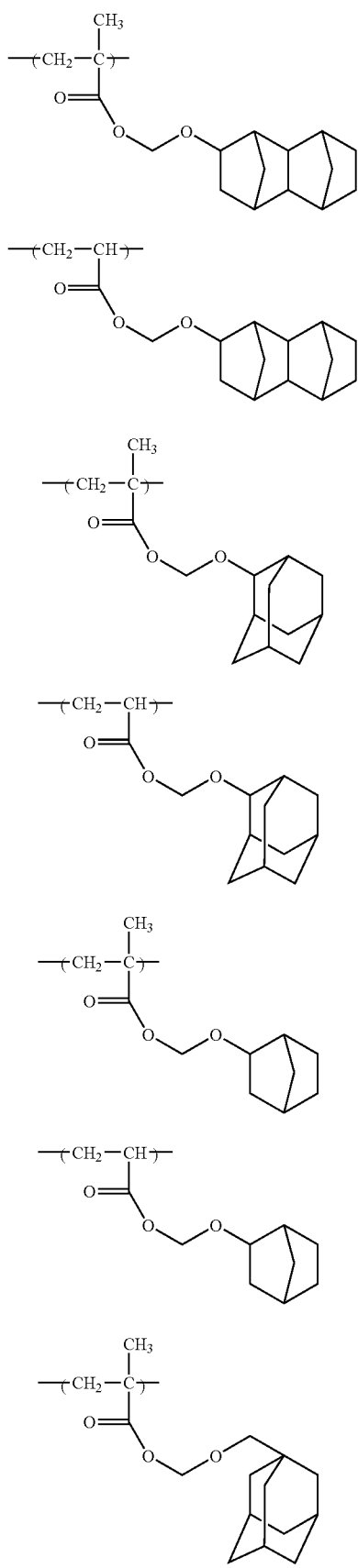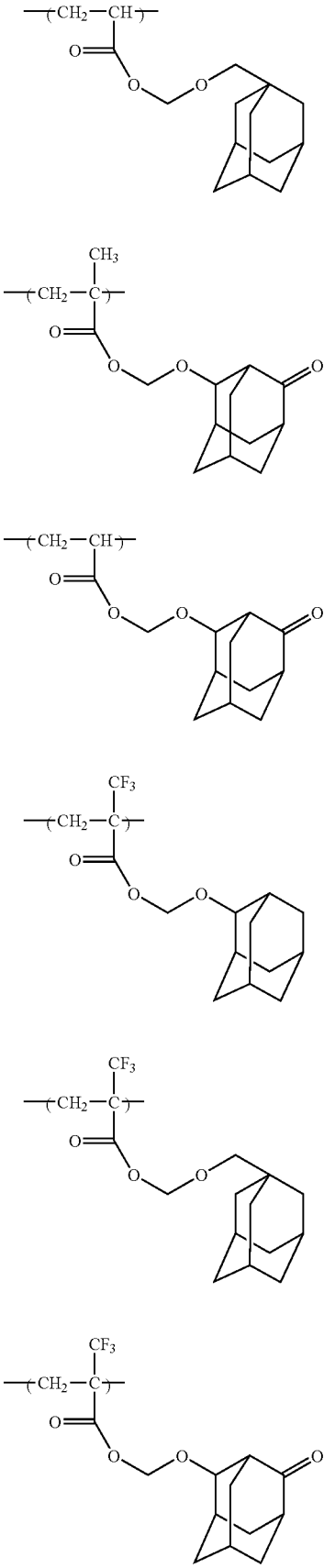

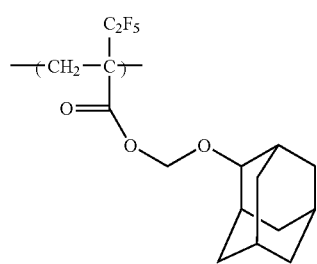
(a1-2-20)
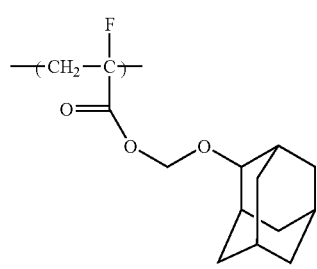
(a1-2-21)
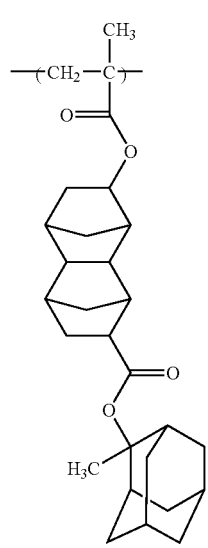
(a1-3-1)
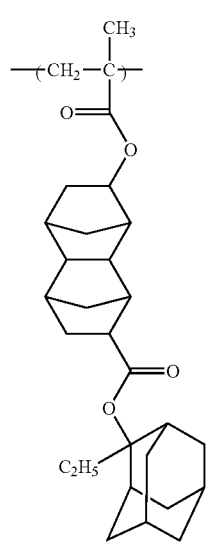
(a1-3-2)
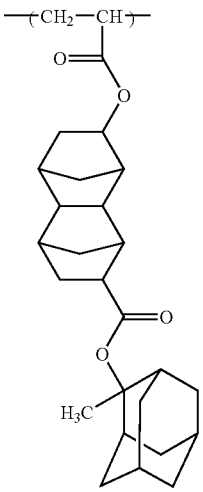
(a1-3-3)
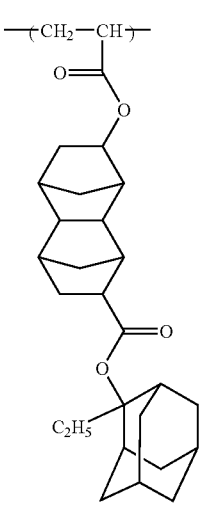
(a1-3-4)
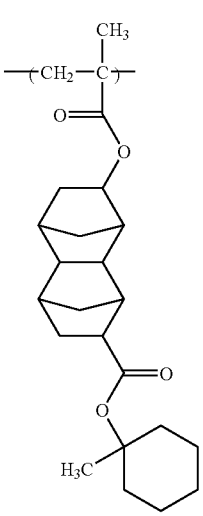
(a1-3-5)

(a1-3-6)
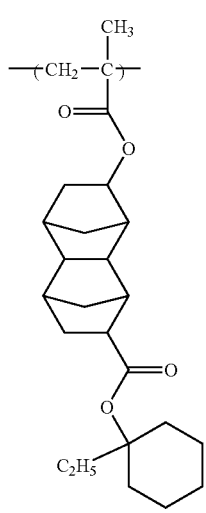
(a1-3-7)
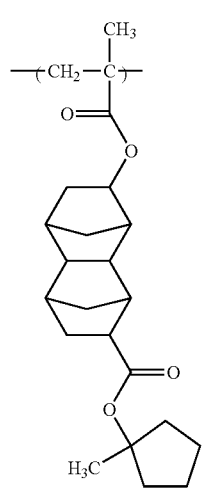
(a1-3-8)
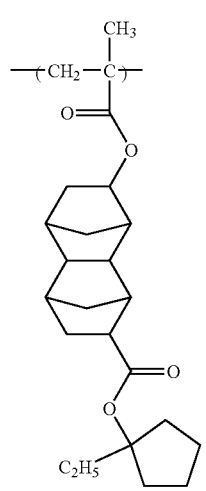
(a1-3-9)
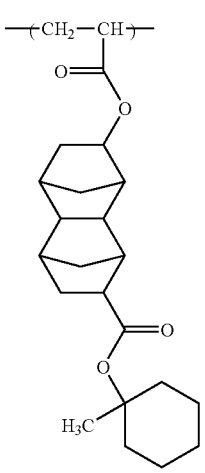
(a1-3-10)
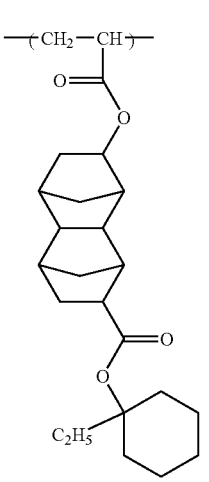
(a1-3-11)
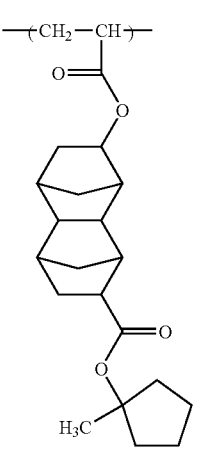

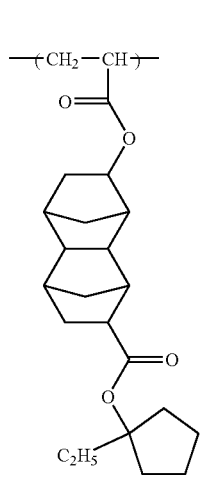 (a1-3-12)
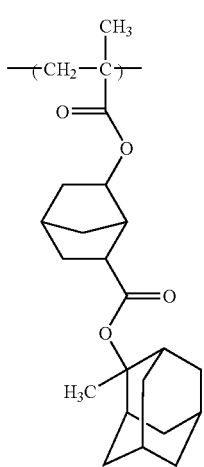 (a1-3-13)
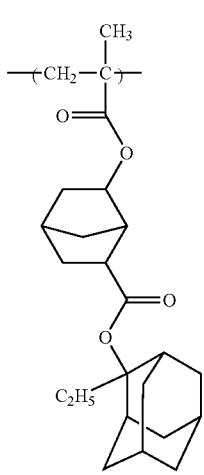 (a1-3-14)
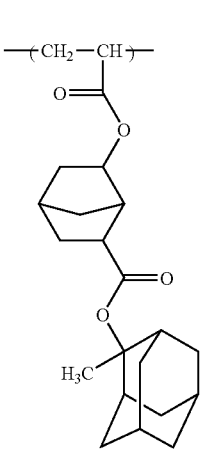 (a1-3-15)
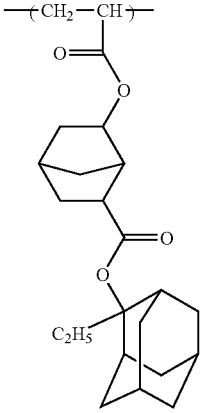 (a1-3-16)
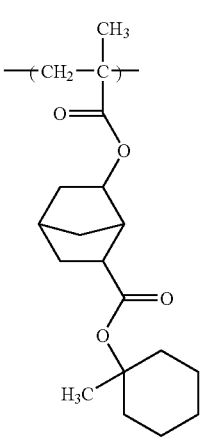 (a1-3-17)

(a1-3-18) 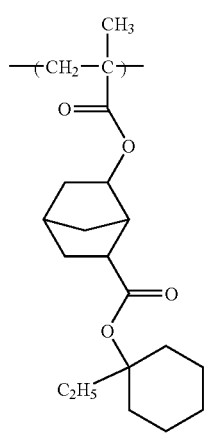
(a1-3-19) 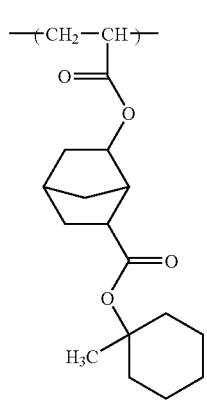
(a1-3-20) 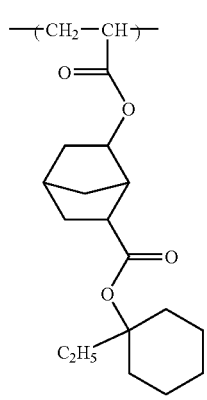
(a1-3-21) 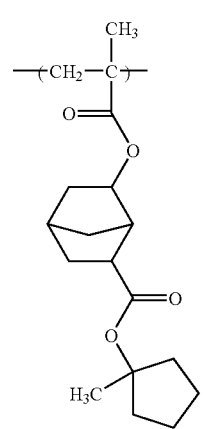
(a1-3-22) 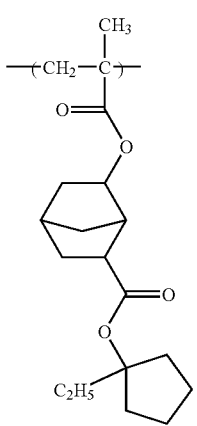
(a1-3-23) 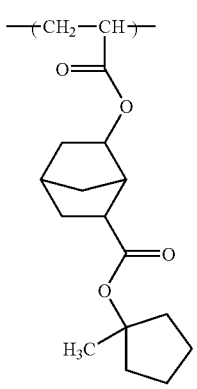
(a1-3-24) 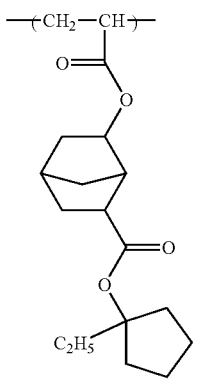
(a1-4-1) 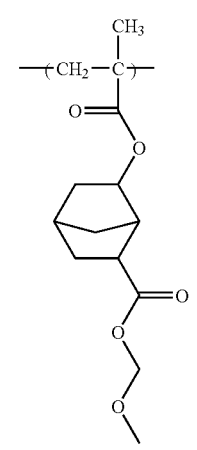

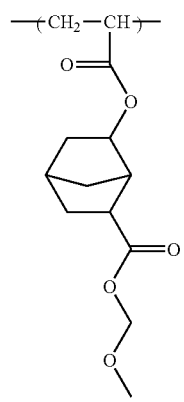 (a1-4-2)
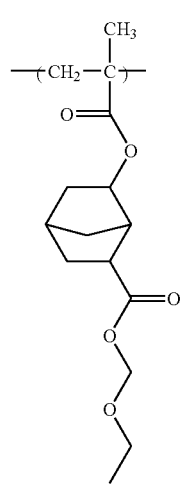 (a1-4-3)
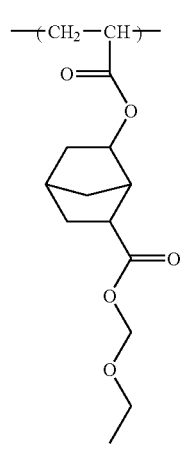 (a1-4-4)
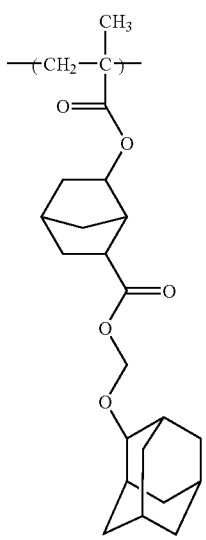 (a1-4-5)
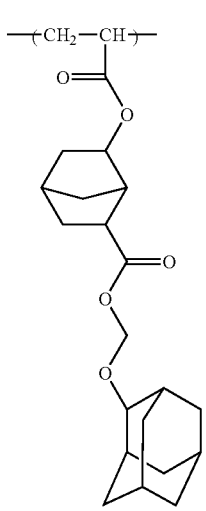 (a1-4-6)
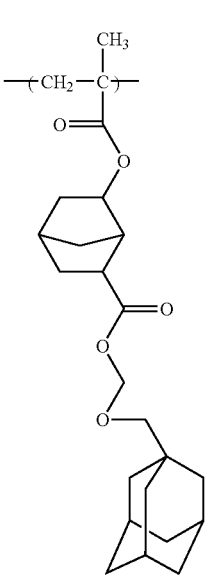 (a1-4-7)

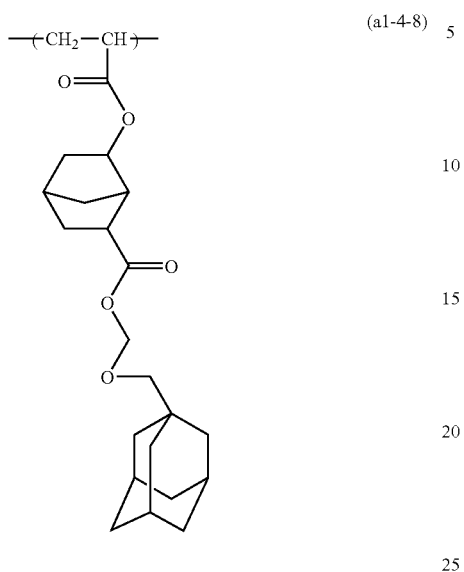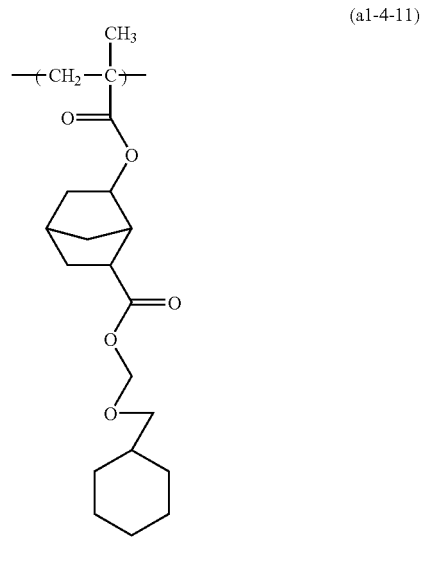

(a1-4-14)
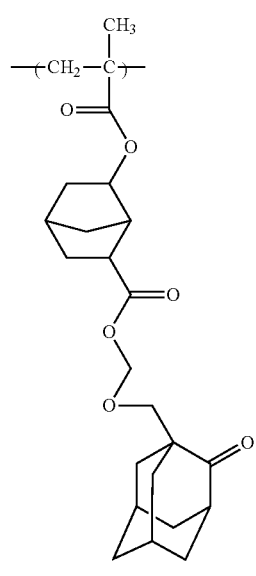
(a1-4-15)
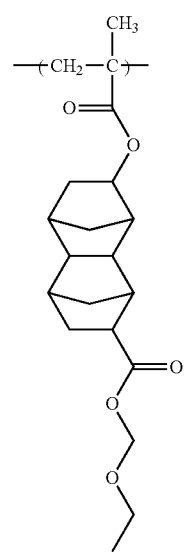
(a1-4-16)
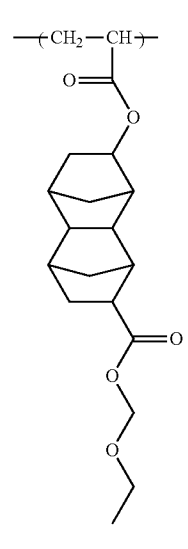
(a1-4-17)
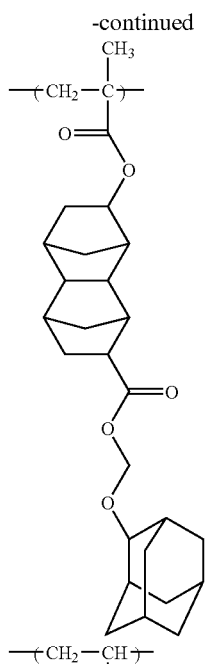
(a1-4-18)
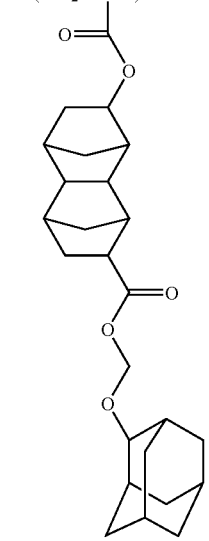
(a1-4-19)
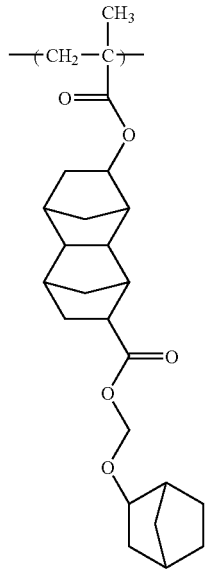

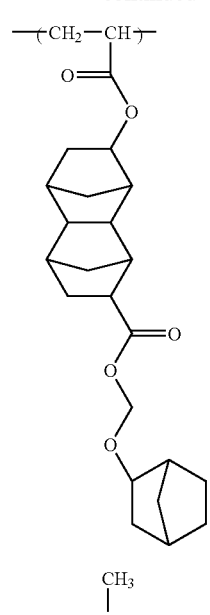
(a1-4-20)
(a1-4-21)
(a1-4-22)
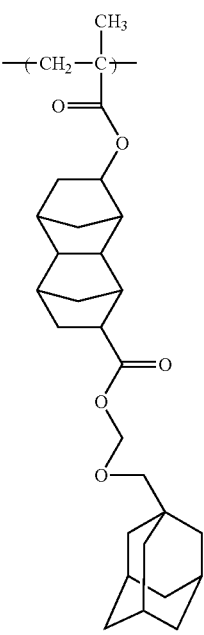
(a1-4-23)
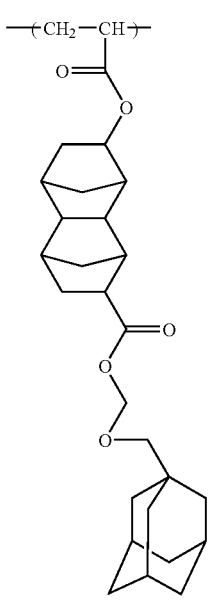
(a1-4-24)

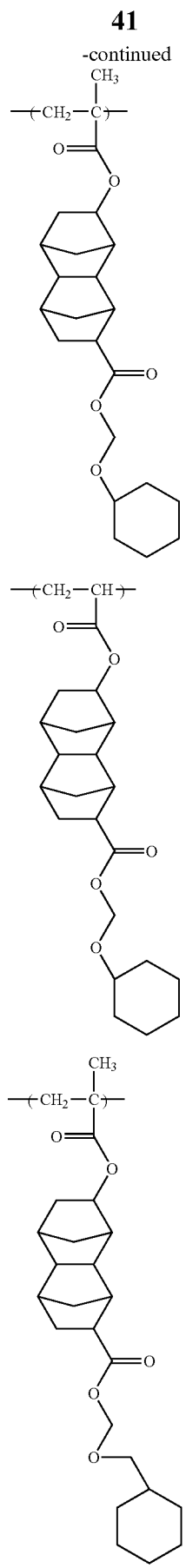
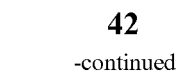
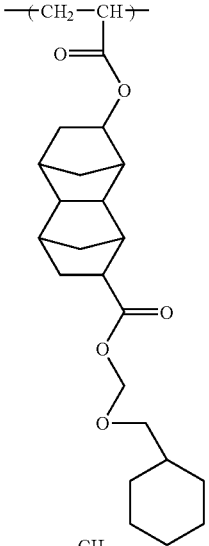
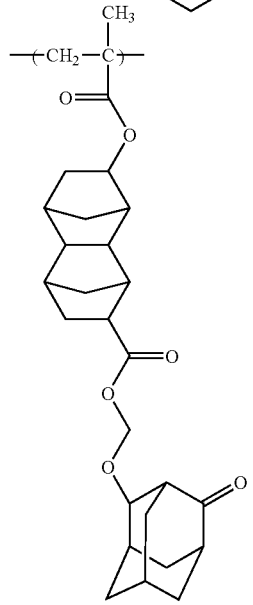
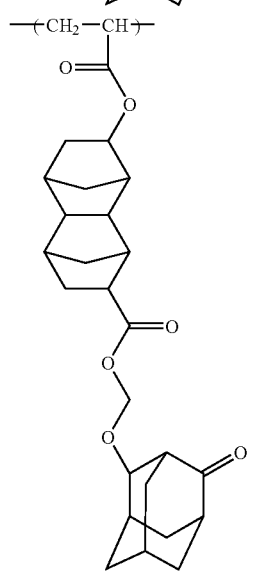
(a1-4-25)
(a1-4-26)
(a1-4-27)
(a1-4-28)
(a1-4-29)
(a1-4-30)

As the structural unit (a1), structural units may be used alone, or a combination of two or more different structural units may be used.

Of the various possibilities, the structural units represented by general formula (a1-1) are preferred. More specifically, the use of at least one structural unit selected from the structural units represented by general formulas (a1-1-1) to (a1-1-6) or (a1-1-35) to (a1-1-41) is more preferred.

As the structural unit (a1), structural units represented by general formula (a1-1-01) including structural units represented by general formulas (a1-1-1) to (a1-1-4), and structural units represented by general formula (a1-1-02) including structural units represented by general formulas (a1-1-36), (a1-1-38), (a1-1-39) and (a1-1-41) are also preferred.

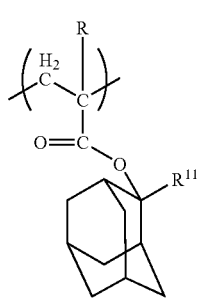

(a1-1-01)

(wherein R represents a hydrogen atom, a halogen atom, a lower alkyl group, or a halogenated lower alkyl group, and $R^{11}$ represents a lower alkyl group)

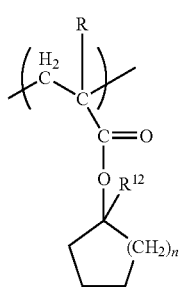

(a1-1-02)

(wherein R represents a hydrogen atom, a halogen atom, a lower alkyl group, or a halogenated lower alkyl group, $R^{12}$ represents a lower alkyl group, and h represents an integer from 1 to 3)

In general formula (a1-1-01), R is as defined above. The lower alkyl group represented by $R^{11}$ is the same as that represented by R, although a methyl group or an ethyl group is preferable.

In the general formula (a1-1-02), R is as defined above. The lower alkyl group represented by $R^{12}$ is the same as that represented by R, although a methyl group or an ethyl group is preferable, and an ethyl group is most preferable. h is preferably either 1 or 2, and most preferably 2.

The proportion of the structural unit (a1) in the copolymer (A1), relative to the combined total of all the structural units that constitute the copolymer (A1), is preferably within a range from 10 to 80 mol %, more preferably from 20 to 70 mol %, and still more preferably from 25 to 50 mol %. Ensuring that this proportion is at least as large as the lower limits of the above ranges enables a pattern to be obtained when the copolymer (A1) is used in a resist composition, whereas ensuring that the proportion is no greater than the upper limits enables a balance to be achieved with the other structural units.

Structural Unit (a2)

The copolymer (A1) contains a structural unit (a2) derived from an acrylate ester which contains a lactone-containing cyclic group.

Here, the term "lactone-containing cyclic group" refers to a cyclic group containing a single ring (lactone ring) containing a —O—C(O)— structure, and this ring is counted as the first ring. Accordingly, the case in which the only ring structure is the lactone ring is referred to as a monocyclic group, and groups containing other ring structures are described as polycyclic groups regardless of the structure of the other rings.

When the copolymer (A1) is used to form a resist film, the use of the lactone-containing cyclic group of the structural unit (a2) is effective in improving the adhesion between the resist film and the substrate, and in enhancing the hydrophilicity of the component (A), thereby improving affinity between the resist film and the developing solution.

There are no particular restrictions on the structural unit (a2), and any unit can be used.

Specific examples of lactone-containing monocyclic groups include groups in which one hydrogen atom has been removed from γ-butyrolactone. Furthermore, examples of lactone-containing polycyclic groups include groups in which one hydrogen atom has been removed from a lactone ring-containing bicycloalkane, tricycloalkane or tetracycloalkane. Groups in which one hydrogen atom has been removed from a lactone-containing tricycloalkane with the type of structural formula shown below are preferred for reasons such as industrial availability.

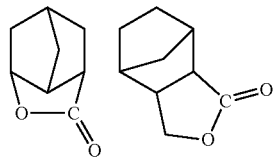

More specific examples of the structural unit (a2) include the structural units represented by general formulas (a2-1) to (a2-5) shown below:

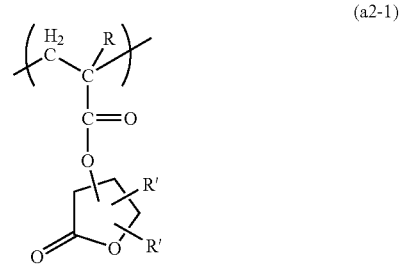

(a2-1)

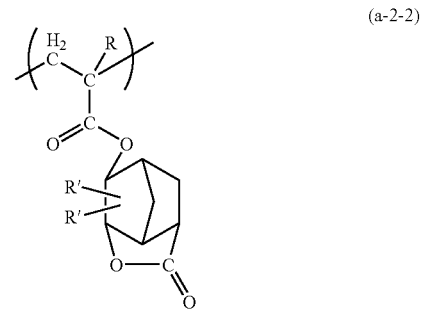

(a-2-2)

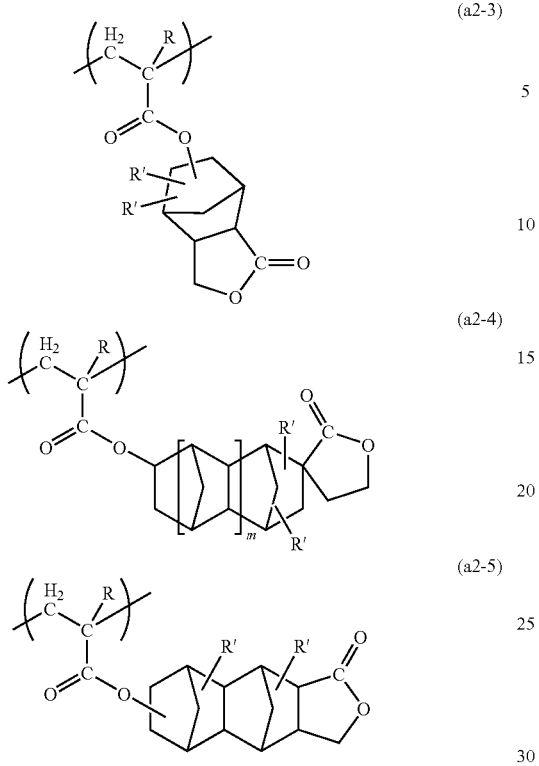

(a2-3)

(a2-4)

(a2-5)

(wherein R represents a hydrogen atom, a halogen atom, a lower alkyl group, or a halogenated lower alkyl group; R' represents a hydrogen atom, a lower alkyl group, or an alkoxy group of 1 to carbon atoms, and m represents an integer of either 0 or 1).

In general formulas (a2-1) to (a2-5), R is the same as that of R in structural unit (a1) shown above.

The lower alkyl group of R' is the same lower alkyl group as that of R in structural unit (a1) shown above.

In general formulas (a2-1) to (a2-5), from the viewpoint of factors such as industrial availability, R' is preferably a hydrogen atom.

Specific structural units of general formulas (a2-1) to (a2-5) are shown below.

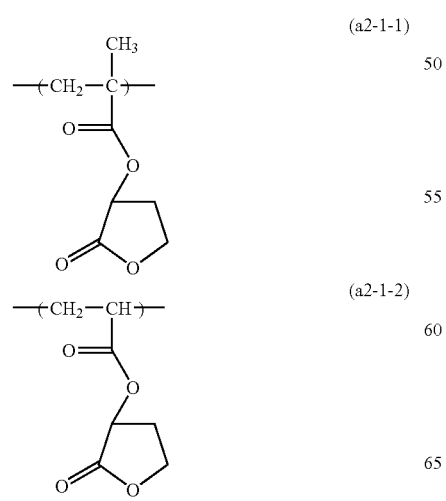

(a2-1-1)

(a2-1-2)

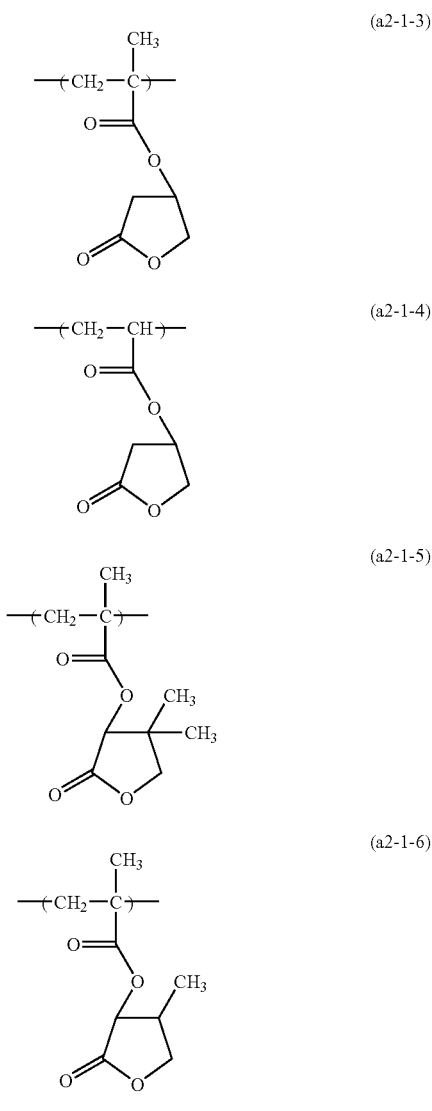

(a2-1-3)

(a2-1-4)

(a2-1-5)

(a2-1-6)

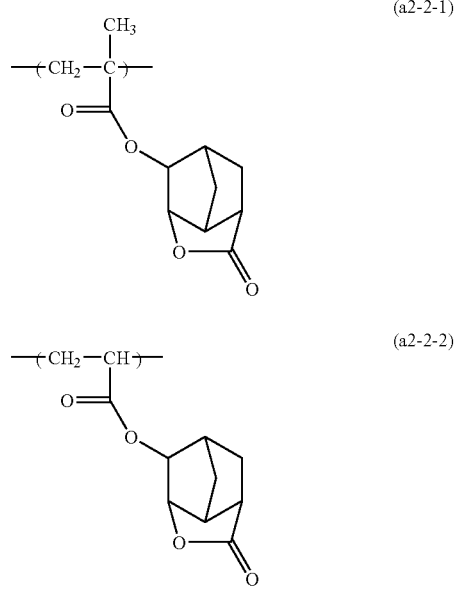

(a2-2-1)

(a2-2-2)

(a2-2-3) 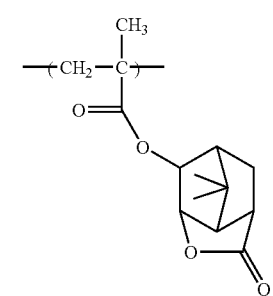
(a2-2-4) 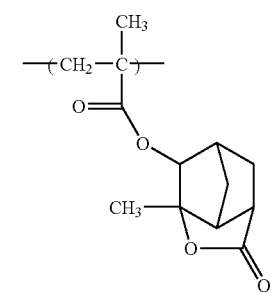
(a2-2-5) 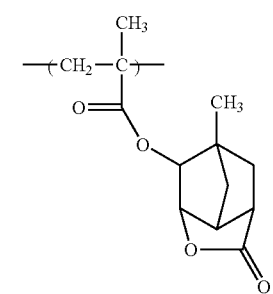
(a2-3-1) 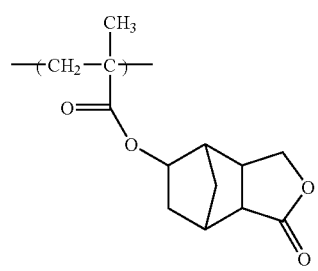
(a2-3-2) 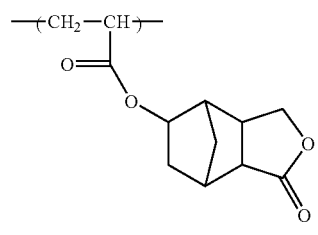
(a2-3-3) 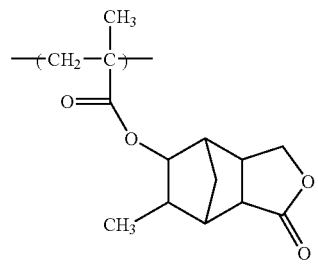
(a2-3-4) 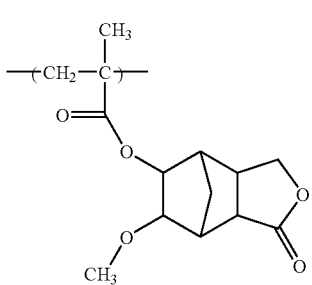
(a2-3-5) 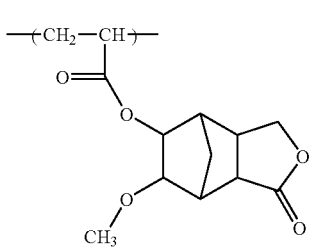
(a2-3-6) 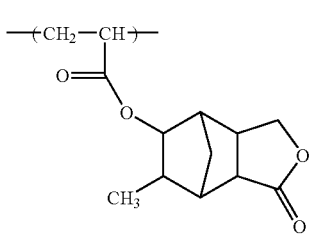
(a2-3-7) 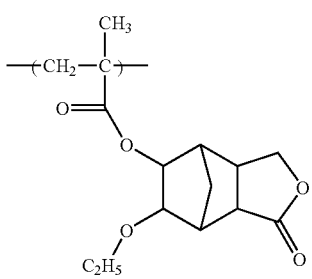
(a2-3-8) 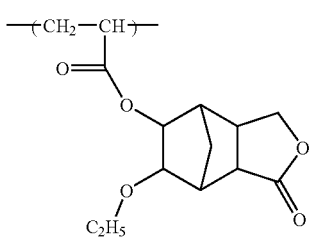
(a2-3-9)

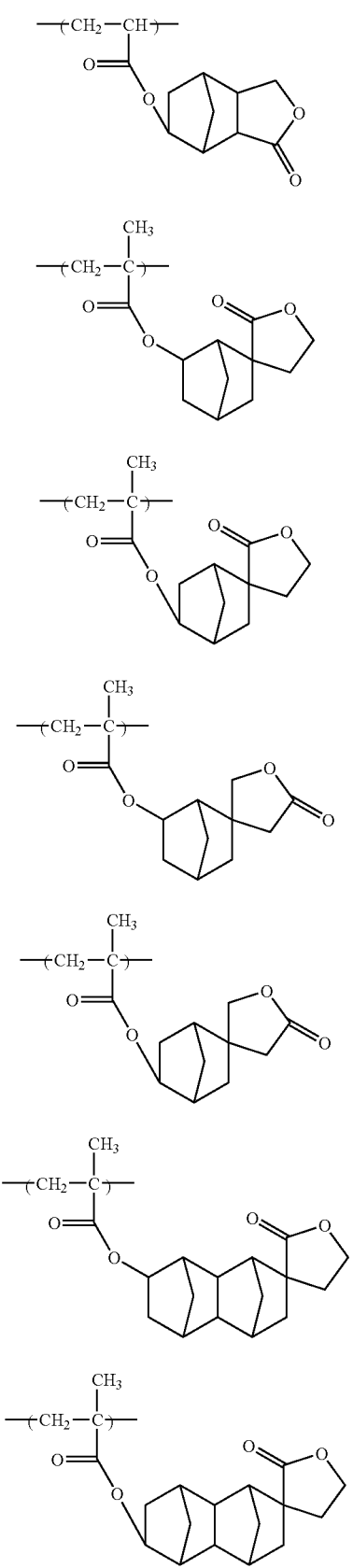
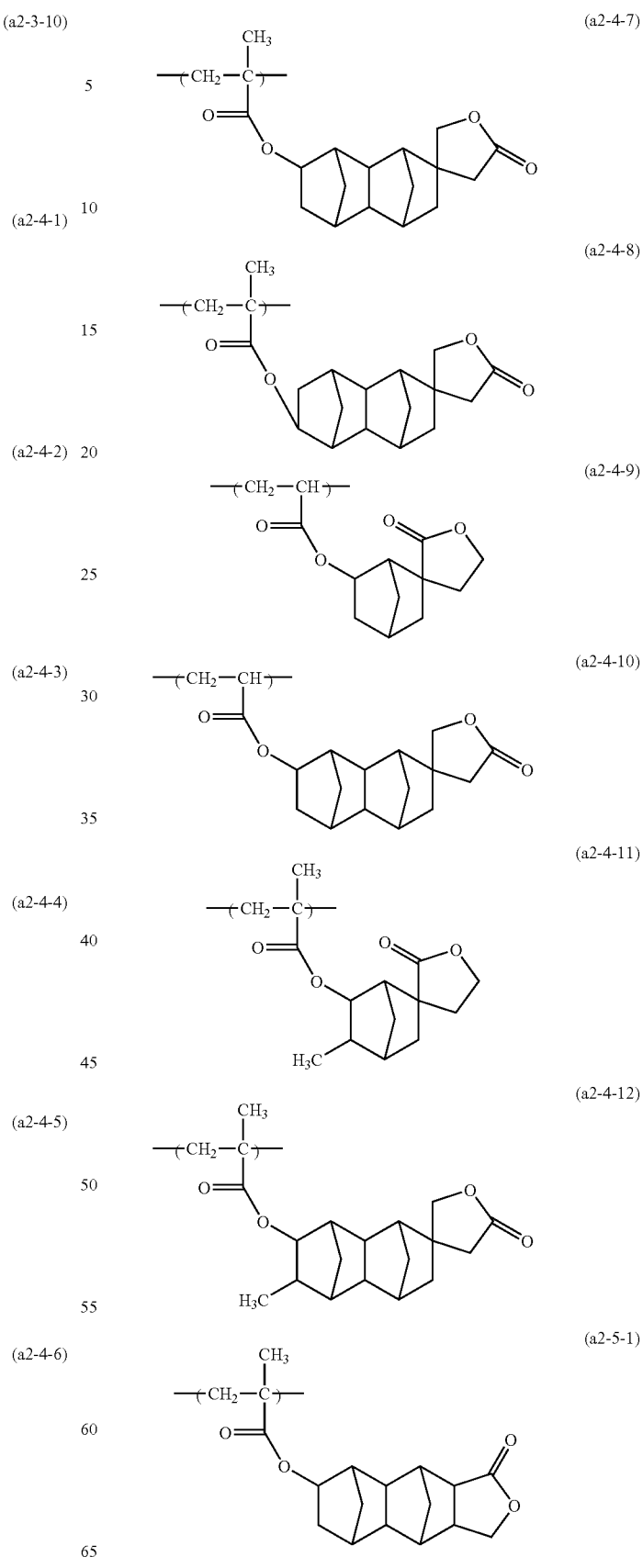

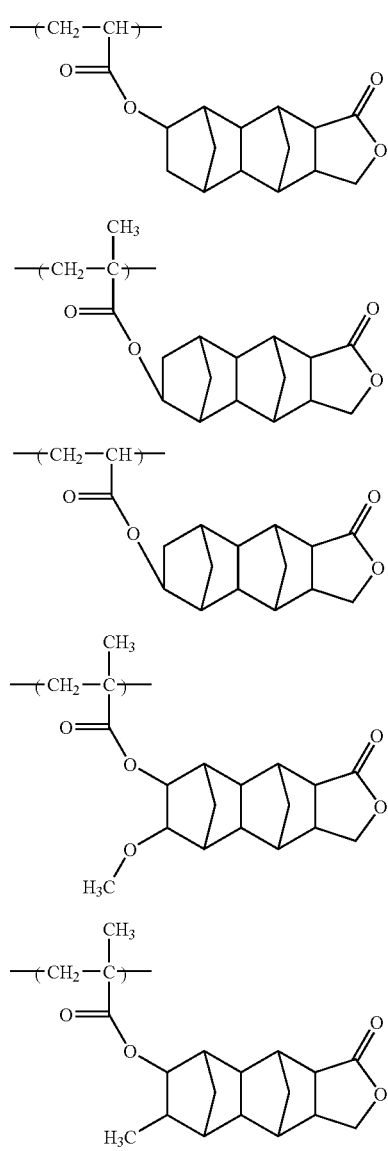

In general formulas (a2-1) to (a2-5), from the viewpoint of factors such as industrial availability, R' is preferably a hydrogen atom.

Of these structural units, at least one structural unit selected from structural units of general formulas (a2-1) to (a2-5) is preferred and the use of at least one structural unit selected from structural units of general formulas (a2-1) and (a2-3) is preferred. Specifically, the use of at least one structural unit selected from structural units of chemical formulas (a2-1-1), (a2-1-2), (a2-2-1), (a2-2-2), (a2-3-1), (a2-3-2), (a2-3-9) and (a2-3-10) is preferred.

As the structural unit (a2), structural units may be used alone, or a combination of two or more different structural units may be used may be used in the copolymer (A1).

The proportion of the structural unit (a2) in the copolymer (A1), relative to the combined total of all the structural units that constitute the copolymer (A1), is preferably within a range from 5 to 60 mol %, more preferably from 10 to 50 mol %, and most preferably from 25 to 50 mol %. Ensuring that this proportion is at least as large as the lower limits of the above ranges enables the effects obtained by including the structural unit (a2) to be satisfactorily realized, whereas ensuring that the proportion is no greater than the upper limits enables a balance to be achieved with the other structural units.

Structural Unit (a3)

The copolymer (A1) preferably contains a structural unit (a3) derived from an acrylate ester containing a polar group-containing aliphatic hydrocarbon group. Inclusion of the structural unit (a3) enhances the hydrophilicity of the resin component (A), thereby improving the affinity with the developing solution, improving the alkali solubility within the exposed portions, and contributing to an improvement in the resolution.

Examples of the polar group include a hydroxyl group, a cyano group, a carboxyl group, or a hydroxyalkyl group in which a portion of the hydrogen atoms of the alkyl group is substituted with fluorine atoms, of which a hydroxyl group is particularly preferred.

Examples of the aliphatic hydrocarbon group include straight-chain or branched-chain hydrocarbon groups (preferably alkylene groups) of 1 to 10 carbon atoms, and polycyclic aliphatic hydrocarbon groups (polycyclic groups). These polycyclic groups can be selected appropriately from the multitude of groups that have been proposed for the resins of resist compositions designed for use with ArF excimer lasers.

Of the various possibilities, structural units that contain aliphatic polycyclic groups containing a hydroxyl group, a cyano group, a carboxyl group, or a hydroxyalkyl group in which a portion of the hydrogen atoms of the alkyl group is substituted with fluorine atoms, and are also derived from an acrylate ester are particularly preferred. Examples of suitable polycyclic groups include groups in which one or more hydrogen atoms have been removed from a bicycloalkane, tricycloalkane or tetracycloalkane. Specific examples include groups in which one or more hydrogen atoms have been removed from a polycycloalkane such as adamantane, norbornane, isobornane, tricyclodecane or tetracyclododecane. Of these polycyclic groups, a group in which two or more hydrogen atoms have been removed from adamantane, a group in which two or more hydrogen atoms have been removed from norbornane, or a group in which two or more hydrogen atoms have been removed from tetracyclododecane is preferred industrially.

When the hydrocarbon group in the polar group-containing aliphatic hydrocarbon group is a straight-chain or branched-chain hydrocarbon group of 1 to 10 carbon atoms, the structural unit (a3) is preferably a structural unit derived from the hydroxyethyl ester of acrylic acid, whereas when the hydrocarbon group is a polycyclic group, structural units represented by formulas (a3-1), (a3-2) and (a3-3) shown below are preferred.

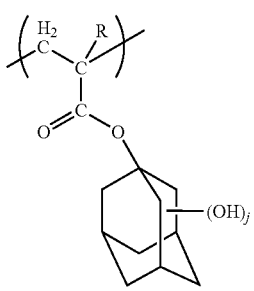

(a3-1)

(a3-2)

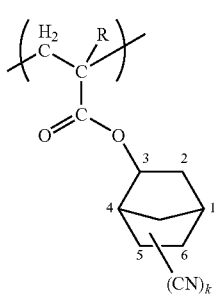

(a3-3)

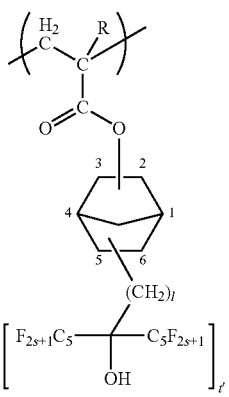

(wherein R is as defined above, j represents an integer from 1 to 3, k represents an integer from 1 to 3, t' represents an integer from 1 to 3, l represents an integer from 1 to 5, and s represents an integer from 1 to 3)

In the formula (a3-1), the value of j is preferably 1 or 2, and more preferably 1. When the value of j is 2, structural units in which the hydroxyl group is bonded to the 3-position and the 5-position of the adamantyl group are preferred. When the value of j is 1, structural units in which the hydroxyl group is bonded to the 3-position of the adamantyl group are preferred.

In the formula (a3-2), the value of k is preferably 1, and structural units in which the cyano group is bonded to either the 5-position or the 6-position of the norbornyl group are preferred.

In the formula (a3-3), the value of t' is preferably 1. The value of l is preferably 1 and the value of s is preferably 1. Structural units in which a 2-norbornyl group or a 3-norbornyl group is bonded to the terminal of the carboxyl group of acrylic acid are preferred. Structural units in which a fluorinated alkyl alcohol is bonded to either the 5-position or the 6-position of the norbornyl group are preferred.

As the structural unit (a3), structural units may be used alone, or a combination of two or more different structural units may be used.

The proportion of the structural unit (a3) in the copolymer (A1), relative to the combined total of all the structural units that constitute the copolymer (A1), is preferably within a range from 5 to 50 mol %, more preferably from 5 to 40 mol %, and most preferably from 5 to 25 mol %.

Structural Unit (a4)

The copolymer (A1) may also include another structural unit (a4) besides the structural units (a1) to (a3), provided the inclusion of this other unit does not impair the effects of the present invention.

As the structural unit (a4), any other structural unit that cannot be classified as one of the above structural units (a1) through (a3) can be used without any particular restrictions, and any of the multitude of conventional structural units used in resist resins for ArF excimer lasers or KrF excimer lasers (and particularly for ArF excimer lasers) can be used.

As the structural unit (a4), a structural unit that contains a non-acid-dissociable aliphatic polycyclic group, and is also derived from an acrylate ester is preferred. Examples of this polycyclic group include the same groups as those described above in relation to the aforementioned structural unit (a1), and any of the multitude of conventional polycyclic groups used in the resin component of resist compositions for ArF excimer lasers or KrF excimer lasers (and particularly for ArF excimer lasers) can be used.

In particular, at least one group selected from a tricyclodecanyl group, an adamantyl group, a tetracyclododecanyl group, an isobornyl group, and a norbornyl group is preferred in terms of factors such as industrial availability. These polycyclic groups may also be substituted with a straight-chain or branched-chain alkyl group of 1 to 5 carbon atoms.

Specific examples of the structural unit (a4) include structures of general formulas (a4-1) to (a4-5) shown below:

(a4-1)

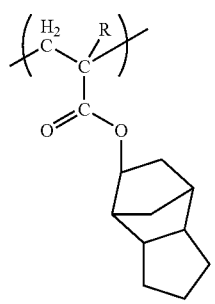

(a4-2)

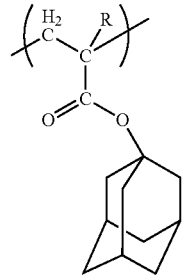

(a4-3)

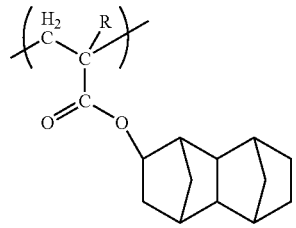

(a4-4)

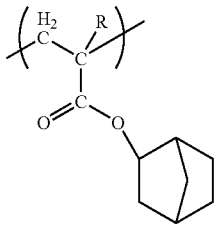

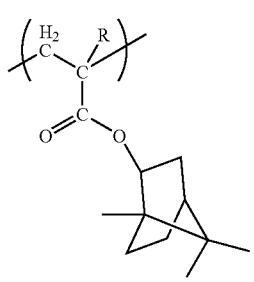

(a4-5)

(wherein R is as defined above).

Although the structural unit (a4) is not an essential component of the copolymer (A1), if included in the copolymer (A1) the proportion of the structural unit (a4), relative to the combined total of all the structural units that constitute the copolymer (A1), is typically within a range from 1 to 30 mol %, and preferably from 10 to 20 mol %.

In the present invention, the copolymer (A1) is a copolymer containing structural units (a1) and (a2), and preferably structural units (a1), (a2) and (a3), and examples of the copolymer (A1) include a copolymer composed of the structural units (a1), (a2) and (a3), and a copolymer composed of the structural units (a1), (a2), (a3) and (a4).

In the present invention, the copolymer (A1) may be used alone, or a combination of two or more different copolymers may be used.

The copolymer (A1) can be obtained by polymerizing a monomer, from which each structural unit is derived, through known radical polymerization using a radical polymerization initiator such as azobisisobutyronitrile (AIBN).

Also, a —C(CF$_3$)$_2$—OH group may be introduced into the copolymer (A1) using in combination with a chain transfer agent such as HS—CH$_2$—CH$_2$—CH$_2$—C(CF$_3$)$_2$—OH upon the above polymerization. The copolymer containing a hydroxyalkyl, in which a portion of the hydrogen atoms of an alkyl group have been substituted with a fluorine atom, introduced therein is effective to reduce developing defects and to decrease LER (line edge roughness: heterogeneous irregularity of line side wall).

There are no particular restrictions on the weight average molecular weight (Mw) (the polystyrene equivalent weight average molecular weight determined by gel permeation chromatography) of the copolymer (A1), and the weight average molecular weight is preferably within a range from 2,000 to 50,000, more preferably from 3,000 to 30,000, and most preferably from 5,000 to 20,000. Ensuring that the weight average molecular weight is smaller than the upper limits of the above ranges enables sufficient solubility in a resist solvent, which is suited for use as a resist, whereas ensuring that the weight average molecular weight is greater than the lower limits of the above ranges enables excellent dry etching resistance and resist pattern profile.

The dispersion degree (Mw/Mn) is preferably from 1.0 to 5.0, more preferably from 1.0 to 3.0, and most preferably from 1.2 to 2.5.

(Component (B))

There are no particular restrictions on the component (B) and it is possible to use acid generators that have conventionally been proposed as an acid generator for chemically amplified photoresists.

As the acid generator, a multitude of acid generators, for example, onium salt-based acid generators such as iodonium salt and sulfonium salt acid generators, oxime sulfonate-based acid generators, diazomethane-based acid generators such as bisalkyl or bisarylsulfonyl diazomethanes and poly(bissulfonyl)diazomethanes acid generators, nitrobenzylsulfonate-based acid generators, iminosulfonate-based acid generators, and disulfone-based acid generators.

As the onium salt-based acid generators, for example, acid generators represented by general formula (b-0) shown below can be preferably used:

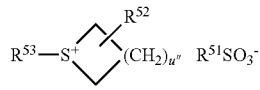

(b-0)

(wherein R$^{51}$ represents a straight-chain, branched-chain, or cyclic alkyl group, or a straight-chain, branched-chain, or cyclic fluorinated alkyl group; R$^{52}$ represents a hydrogen atom, a hydroxyl group, a halogen atom, a straight-chain or branched-chain alkyl group, a straight-chain or branched-chain halogenated alkyl group, or a straight-chain or branched-chain alkoxy group; R$^{53}$ represents an aryl group which may include a substituent; and u" represents an integer from 1 to 3).

In general formula (b-0), R$^{51}$ represents a straight-chain, branched-chain, or cyclic alkyl group, or a straight-chain, a branched-chain, or cyclic fluorinated alkyl group.

The straight-chain or branched-chain alkyl group is preferably a straight-chain or branched-chain alkyl group of 1 to 10 carbon atoms, more preferably 1 to 8 carbon atoms, and most preferably 1 to 4 carbon atoms.

The cyclic alkyl group is preferably a cyclic alkyl group of 4 to 12 carbon atoms, more preferably 5 to 10 carbon atoms, and most preferably 6 to 10 carbon atoms.

The fluorinated alkyl group is preferably a fluorinated alkyl group of 1 to 10 carbon atoms, more preferably 1 to 8 carbon atoms, and most preferably 1 to 4 carbon atoms. The fluorination ratio of the fluorinated alkyl group (the proportion of fluorine atoms, with which hydrogen atoms are substituted, relative to the total number of hydrogen atoms in the alkyl group) is preferably from 10 to 100%, more preferably from 50 to 100%, and groups in which all of the hydrogen atoms have been substituted with fluorine atoms yield the strongest acids, and are consequently the most preferred.

R$^{51}$ is most preferably a straight-chain alkyl group or fluorinated alkyl group.

R$^{52}$ is a hydrogen atom, a hydroxyl group, a halogen atom, a straight-chain, branched-chain, or cyclic alkyl group, a straight-chain or branched-chain halogenated alkyl group, or a straight-chain or branched-chain alkoxy group.

In R$^{52}$, examples of the halogen atom include a fluorine atom, a bromine atom, a chlorine atom, and an iodine atom, of which a fluorine atom is preferable.

In R$^{52}$, the alkyl group is a straight-chain or branched-chain and is preferably a group of 1 to 5 carbon atoms, particularly 1 to 4 carbon atoms, and more preferably 1 to 3 carbon atoms.

In R$^{52}$, the halogenated alkyl group is a group in which either a portion of, or all of, the hydrogen atoms in the alkyl group are substituted with a halogen atom. Herein, the alkyl group includes the same "alkyl group" represented by R$^{52}$. The halogen atom to be substituted includes the same groups as those described for the above "halogen atom". In the halogenated alkyl group, 50 to 100% of all the hydrogen atoms are preferably substituted with the halogen atom and, more preferably, all the hydrogen atoms are substituted.

In $R^{52}$, the alkoxy group is a straight-chain or branched-chain alkoxy group and is preferably a group of 1 to 5 carbon atoms, particularly 1 to 4 carbon atoms, and more preferably 1 to 3 carbon atoms.

$R^{52}$ is preferably a hydrogen atom.

$R^{53}$ is an aryl group which may include a substituent and examples of the aryl group having a basic ring (mother ring) structure in which the substituent has been removed include a naphthyl group, a phenyl group, or an anthracenyl group. In view of the effects of the present invention and absorption of exposure light such as an ArF excimer laser, a phenyl group is preferable.

Examples of the substituent include a hydroxyl group or a lower alkyl group (straight-chain or branched-chain and is preferably of no greater than 5 carbon atoms, and is particularly preferably a methyl group).

The aryl group represented by $R^{53}$ preferably includes no substituent.

u" is an integer from 1 to 3, preferably 2 or 3, and particularly preferably 3.

Preferred examples of the acid generator represented by general formula (b-0) include the following.

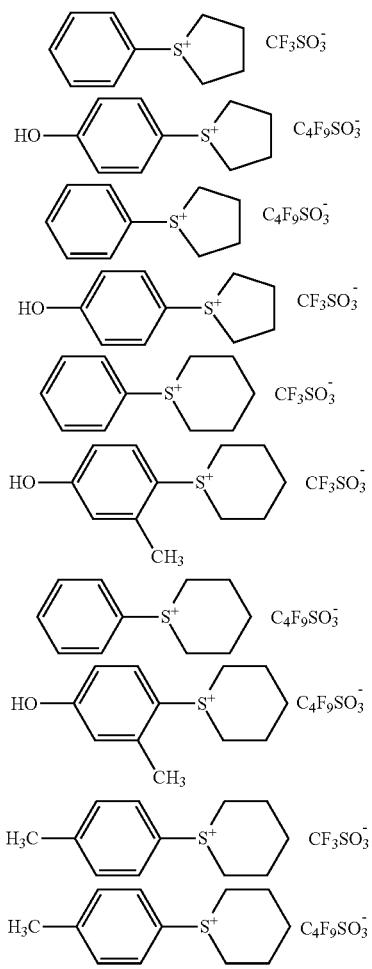

Of these acid generators, compounds represented by chemical formula (b-0-1) and (b-0-2) are preferable.

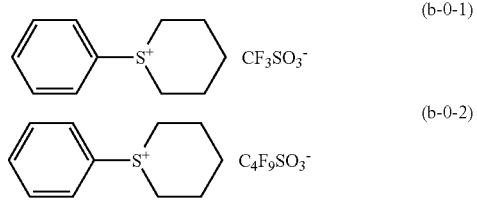

Acid generators represented by general formula (b-0) may be used alone, or a combination of two or more thereof may be used.

As the onium salt-based acid generator other than the acid generator represented by general formula (b-0), for example, a compound represented by general formula (b-1) or (b-2) shown below is also preferably used:

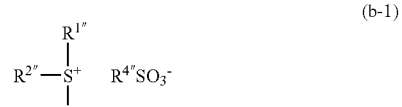

(wherein $R^{1"}$ to $R^{3"}$, and $R^{5"}$ and $R^{6"}$ each represents, independently, an aryl group or an alkyl group; and $R^{4"}$ represents a straight-chain, branched, or cyclic alkyl group or fluorinated alkyl group; provided that at least one of $R^{1"}$ to $R^{3"}$ represents an aryl group, and at least one of $R^{5"}$ and $R^{6"}$ represents an aryl group).

In the formula (b-1), $R^{1"}$ to $R^{3"}$ each represents, independently, an aryl group or an alkyl group. Of the groups $R^{1"}$ to $R^{3"}$, at least one group represents an aryl group. Compounds in which at least two of $R^{1"}$ to $R^{3"}$ represent aryl groups are preferred, and compounds in which all of $R^{1"}$ to $R^{3"}$ are aryl groups are the most preferred.

There are no particular restrictions on the aryl groups of $R^{1"}$ to $R^{3"}$, and suitable examples include aryl groups of 6 to 20 carbon atoms, in which either a portion of, or all of, the hydrogen atoms of these aryl groups may be substituted with alkyl groups, alkoxy groups, or halogen atoms. In terms of enabling low-cost synthesis, aryl groups of 6 to 10 carbon atoms are preferred. Specific examples of suitable groups include a phenyl group and a naphthyl group.

Alkyl groups that may be used for substitution of the hydrogen atoms of the above aryl groups are preferably alkyl groups of 1 to 5 carbon atoms, and a methyl group, an ethyl group, a propyl group, an n-butyl group or a tert-butyl group is the most preferred.

Alkoxy groups that may be used for substitution of the hydrogen atoms of the above aryl groups are preferably alkoxy groups of 1 to 5 carbon atoms, and a methoxy group or an ethoxy group is the most preferred. Halogen atoms that may be used for substitution of the hydrogen atoms of the above aryl groups are preferably fluorine atoms.

There are no particular restrictions on the alkyl groups of $R^{1"}$ to $R^{3"}$, and suitable examples include straight-chain, branched-chain, or cyclic alkyl groups of 1 to 10 carbon atoms. From the viewpoint of achieving excellent resolution, alkyl groups of 1 to 5 carbon atoms are preferred. Specific examples include a methyl group, an ethyl group, an n-propyl group, an isopropyl group, an n-butyl group, an isobutyl group, an n-pentyl group, a cyclopentyl group, a hexyl group, a cyclohexyl group, a nonyl group, and a decanyl group, although in terms of achieving excellent resolution and enabling low-cost synthesis, a methyl group is the most preferred.

Of the above possibilities, compounds in which $R^{1\prime\prime}$ to $R^{3\prime\prime}$ are all phenyl groups are the most preferred.

The group $R^{4\prime\prime}$ represents a straight-chain, branched-chain, or cyclic alkyl group or fluorinated alkyl group.

As the straight-chain alkyl group, groups of 1 to 10 carbon atoms are preferred, groups of 1 to 8 carbon atoms are more preferred, and groups of 1 to 4 carbon atoms are the most preferred.

Suitable cyclic alkyl groups include the same groups as those listed above in relation to the group $R^{1\prime\prime}$, and cyclic groups of 4 to 15 carbon atoms are preferred, groups of 4 to 10 carbon atoms are more preferred, and groups of 6 to 10 carbon atoms are the most preferred.

As the above fluorinated alkyl group, groups of 1 to 10 carbon atoms are preferred, groups of 1 to 8 carbon atoms are more preferred, and groups of 1 to 4 carbon atoms are the most preferred. Furthermore, the fluorination ratio of the fluorinated alkyl group (the proportion of fluorine atoms in the alkyl group) is preferably within a range from 10 to 100%, and more preferably from 50 to 100%, and groups in which all of the hydrogen atoms have been substituted with fluorine atoms yield the strongest acids, and are consequently the most preferred.

The group $R^{4\prime\prime}$ is most preferably a straight-chain or cyclic alkyl group, or a fluorinated alkyl group.

In the formula (b-2), $R^{5\prime\prime}$ to $R^{6\prime\prime}$ each represents, independently, an aryl group or an alkyl group. At least one of $R^{5\prime\prime}$ and $R^{6\prime\prime}$ represents an aryl group. Compounds in which both of $R^{5\prime\prime}$ and $R^{6\prime\prime}$ are aryl groups are the most preferred.

Examples of the aryl groups of the groups $R^{5\prime\prime}$ and $R^{6\prime\prime}$ include the same aryl groups as those described above for the groups $R^{1\prime\prime}$ to $R^{3\prime\prime}$.

Examples of the alkyl groups of the groups $R^{5\prime\prime}$ and $R^{6\prime\prime}$, include the same alkyl groups as those described above for the groups $R^{1\prime\prime}$ to $R^{3\prime\prime}$.

Of the above possibilities, compounds in which $R^{5\prime\prime}$ and $R^{6\prime\prime}$ are all phenyl groups are the most preferred.

Examples of the group $R^{4\prime\prime}$ in the formula (b-2) include the same as those described above for the group $R^{4\prime\prime}$ in formula (b-1).

Specific examples of the onium salt-based acid generators represented by (b-1) and (b-2) include diphenyliodonium trifluoromethane sulfonate or nonafluorobutane sulfonate, bis(4-tert-butylphenyl)iodonium trifluoromethane sulfonate or nonafluorobutane sulfonate, triphenylsulfonium trifluoromethane sulfonate, heptafluoropropane sulfonate or nonafluorobutane sulfonate, tri(4-methylphenyl)sulfonium trifluoromethane sulfonate, heptafluoropropane sulfonate or nonafluorobutane sulfonate, dimethyl(4-hydroxynaphthyl)sulfonium trifluoromethane sulfonate, heptafluoropropane sulfonate or nonafluorobutane sulfonate, monophenyldimethyl sulfonium trifluoromethane sulfonate, heptafluoropropane sulfonate or nonafluorobutane sulfonate, diphenylmonomethylsulfonium trifluoromethane sulfonate, heptafluoropropane sulfonate or nonafluorobutane sulfonate, (4-methylphenyl)diphenylsulfonium trifluoromethane sulfonate, heptafluoropropane sulfonate or nonafluorobutane sulfonate, (4-methoxyphenyl)diphenylsulfonium trifluoromethane sulfonate, heptafluoropropane sulfonate or nonafluorobutane sulfonate, tri(4-tert-butyl)phenylsulfonium trifluoromethane sulfonate, heptafluoropropane sulfonate or nonafluorobutane sulfonate, and diphenyl(1-(4-methoxy)naphthyl)sulfonium trifluoromethane sulfonate, heptafluoropropane sulfonate or nonafluorobutane sulfonate. Furthermore, onium salt acid generators in which the anion portion of the above onium salts has been substituted with a methanesulfonate, n-propanesulfonate, n-butanesulfonate, or n-octanesulfonate can also be used. Of these onium salts, bis(4-tert-butylphenyl)iodonium trifluoromethanesulfonate is preferred.

Also, acid generators of onium salts in which the anion portion has been substituted with an anion portion represented by general formula (b-3) or (b-4) shown below in general formula (b-1) or (b-2) (the cation portion is the same as in (b-1) or (b-2)) can be used.

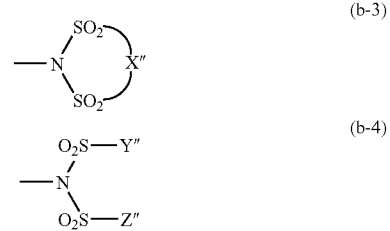

(wherein X″ represents an alkylene group of 2 to 6 carbon atoms in which at least one hydrogen atom has been substituted with a fluorine atom; and Y′ and Z″ each represents, independently, an alkyl group of 1 to 10 carbon atoms in which at least one hydrogen atom has been substituted with a fluorine atom)

The group X″ is a straight-chain or branched-chain alkylene group in which at least one hydrogen atom has been substituted with a fluorine atom, and the number of carbon atoms in the alkylene group is typically within a range from 2 to 6, preferably from 3 to 5, and most preferably 3.

Y″ and Z″ each represents, independently, a straight-chain or branched-chain alkyl group in which at least one hydrogen atom has been substituted with a fluorine atom, and the number of carbon atoms in the alkyl group is typically within a range from 1 to 10, preferably from 1 to 7, and most preferably from 1 to 3.

Within the above ranges for the numbers of carbon atoms, lower numbers of carbon atoms within the alkylene group X″ or the alkyl groups Y″ and Z″ result in better solubility within the resist solvent, and are consequently preferred.

Furthermore, in the alkylene group X″ or the alkyl groups Y″ and Z″, the larger the number of hydrogen atoms that have been substituted with fluorine atoms, the stronger the acid becomes, and the transparency relative to high energy light beams of 200 nm or less or electron beams also improves favorably. The fluorine atom proportion within the alkylene groups or alkyl groups, namely the fluorination ratio, is preferably within a range from 70 to 100%, and more preferably from 90 to 100%, and perfluoroalkylene groups or perfluoroalkyl groups in which all of the hydrogen atoms have been substituted with fluorine atoms are the most preferable.

In the present invention, the oxime sulfonate acid-based generator describes a compound that contains at least one structure represented by general formula (B-1) shown below, wherein the compound generates an acid upon irradiation. These types of oxime sulfonate-based acid generators are widely used within chemically amplified resist compositions, and any of these compounds may be selected and used.

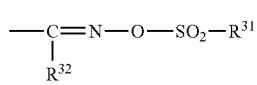

(B-1)

(wherein, in formula (B-1), $R^{31}$ and $R^{32}$ each represents, independently, an organic group)

An organic group $R^{31}$ or $R^{32}$ is a group which includes a carbon atom and may include an atom other than a carbon atom (for example, a hydrogen atom, an oxygen atom, a nitrogen atom, a sulfur atom, or a halogen atom (fluorine atom, chlorine atom, or the like)).

The organic group represented by $R^{31}$ is preferably a straight-chain, branched-chain, or cyclic alkyl group, or an aryl group. These alkyl group and aryl group may include a substituent. There are no particular restrictions on the substituent and examples include a fluorine atom, and a straight-chain, branched-chain, or cyclic alkyl group of 1 to 6 carbon atoms. Herein, the expression "includes a substituent" means that either a portion of, or all of, the hydrogen atoms of the alkyl group or the aryl group are substituted with the substituent.

The alkyl group is preferably an alkyl group of 1 to 20 carbon atoms, more preferably from 1 to 10 carbon atoms, still more preferably from 1 to 8 carbon atoms, particularly preferably from 1 to 6 carbon atoms, and most preferably from 1 to 4 carbon atoms. The alkyl group is preferably an alkyl group that has been partially or completely halogenated (hereinafter referred sometimes to as a halogenated alkyl group). The expression "alkyl group that has been partially halogenated" refers to an alkyl group in which a portion of the hydrogen atoms are substituted with halogen atoms, whereas the expression "alkyl group that has been completely halogenated" refers to an alkyl group in which all of the hydrogen atoms are substituted with halogen atoms. Examples of the halogen atom include a fluorine atom, a chlorine atom, a bromine atom, and an iodine atom, of which a fluorine atom is particularly preferable. Namely, the halogenated alkyl group is preferably a fluorinated alkyl group.

The aryl group is preferably an aryl group of 4 to 20 carbon atoms, more preferably 4 to 10 carbon atoms, and most preferably 6 to 10 carbon atoms. The aryl group is particularly preferably an aryl group that has been partially or completely halogenated. The expression "aryl group that has been partially halogenated" refers to an aryl group in which a portion of the hydrogen atoms are substituted with halogen atoms, whereas the expression "aryl group that has been completely halogenated" refers to an aryl group in which all of the hydrogen atoms are substituted with halogen atoms.

As $R^{31}$, an alkyl group of 1 to 4 carbon atoms which includes no substituent, or a fluorinated alkyl group of 1 to 4 carbon atoms is particularly preferable.

As the organic group represented by $R^{32}$, a straight-chain, branched-chain, or cyclic alkyl group, aryl group or cyano group is preferred. Examples of the alkyl group or aryl group represented by $R^{32}$ include the same alkyl group or aryl group exemplified above in relation to the group $R^{31}$.

As $R^{32}$, a cyano group, an alkyl group of 1 to 8 carbon atoms which includes no substituent, or a fluorinated alkyl group of 1 to 8 carbon atoms is particularly preferable.

More preferred oxime sulfonate acid generators include compounds represented by general formula (B-2) or (B-3):

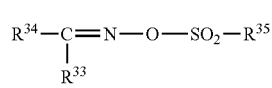

(B-2)

(wherein, in formula (B-2), $R^{33}$ is a cyano group, or an alkyl group or a halogenated alkyl group which includes no substituent; $R^{34}$ is an aryl group; and $R^{35}$ is an alkyl group or halogenated alkyl group which includes no substituent).

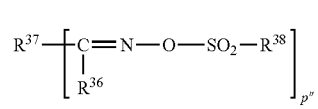

(B-3)

(wherein, in formula (B-3), $R^{36}$ is a cyano group, or an alkyl group or a halogenated alkyl group which includes no substituent, $R^{37}$ is a di- or trivalent aromatic hydrocarbon group, $R^{38}$ is an alkyl group or a halogenated alkyl group which includes no substituent, and p" is either 2 or 3]

In general formula (B-2) shown above, the alkyl group or halogenated alkyl group including no substituent group represented by $R^{33}$ is preferably a group of 1 to 10 carbon atoms, more preferably 1 to 8 carbon atoms, and most preferably 1 to 6 carbon atoms.

$R^{33}$ is preferably a halogenated alkyl group, and more preferably a fluorinated alkyl group.

In the fluorinated alkyl group represented by $R^{33}$, groups in which 50% or more of the hydrogen atoms in the alkyl group are fluorinated are preferable, groups in which 70% or more of the hydrogen atoms in the alkyl group are fluorinated are more preferable, and groups in which 90% or more of the hydrogen atoms in the alkyl group are fluorinated are still more preferable.

Examples of the aryl group represented by $R^{34}$ include groups in which one hydrogen atom has been removed from the ring of the aromatic hydrocarbon, such as a phenyl group, a biphenyl group, a fluorenyl group, a naphthyl group, an anthracyl group, and a phenanthryl group; and heteroaryl groups in which a portion of the carbon atoms that form the ring of these groups has been substituted with a hetero atom such as an oxygen atom, a sulfur atom, or a nitrogen atom. Of these groups, a fluorenyl group is preferred.

The aryl group represented by $R^{34}$ may include a substituent such as an alkyl group of 1 to 10 carbon atoms, a halogenated alkyl group, or an alkoxy group. The alkyl group or the halogenated alkyl group in the substituent is preferably a group of 1 to 8, and more preferably 1 to 4 carbon atoms. The halogenated alkyl group is preferably a fluorinated alkyl group.

The alkyl group or halogenated alkyl group represented by $R^{35}$ which includes no substituent is preferably a group of 1 to 10 carbon atoms, more preferably 1 to 8 carbon atoms, and most preferably 1 to 6 carbon atoms.

$R^{35}$ is preferably a halogenated alkyl group, and more preferably a fluorinated alkyl group, and an alkyl group that has been partially fluorinated is most preferable.

In the fluorinated alkyl group represented by $R^{35}$, groups in which 50% or more of the hydrogen atoms in the alkyl group are fluorinated are preferable, groups in which 70% or more of the hydrogen atoms in the alkyl group are fluorinated are more preferable, and groups in which 90% or more of the hydrogen atoms in the alkyl group are fluorinated are still more preferable because they increase the strength of the acid that is generated. Completely fluorinated alkyl groups in which 100% of the hydrogen atoms have been substituted with fluorine atoms are the most preferable.

In general formula (B-3) shown above, examples of the alkyl group or halogenated alkyl group represented by $R^{36}$ which includes no substituent include the same alkyl group or halogenated alkyl group represented by $R^{33}$ which includes no substituent.

Examples of the di- or trivalent aromatic hydrocarbon group represented by $R^{37}$ include groups in which one or two hydrogen atoms have been removed furthermore from the aryl group represented by $R^{34}$.

Examples of the alkyl group or halogenated alkyl group represented by $R^{38}$ which includes no substituent include the same alkyl group or halogenated alkyl group represented by $R^{35}$ which includes no substituent.

p" is preferably 2.

Specific examples of the oxime sulfonate-based acid generators include α-(p-toluenesulfonyloxyimino)-benzyl cyanide, α-(p-chlorobenzenesulfonyloxyimino)-benzyl cyanide, α-(4-nitrobenzenesulfonyloxyimino)-benzyl cyanide, α-(4-nitro-2-trifluoromethylbenzenesulfonyloxyimino)-benzyl cyanide, α-(benzenesulfonyloxyimino)-4-chlorobenzyl cyanide, α-(benzenesulfonyloxyimino)-2,4-dichlorobenzyl cyanide, α-(benzenesulfonyloxyimino)-2,6-dichlorobenzyl cyanide, α-(benzenesulfonyloxyimino)-4-methoxybenzyl cyanide, α-(2-chlorobenzenesulfonyloxyimino)-4-methoxybenzyl cyanide, α-(benzenesulfonyloxyimino)-thien-2-yl acetonitrile, α-(4-dodecylbenzenesulfonyloxyimino)-benzyl cyanide, α-[(p-toluenesulfonyloxyimino)-4-methoxyphenyl]acetonitrile, α-[(dodecylbenzenesulfonyloxyimino)-4-methoxyphenyl]acetonitrile, α-(tosyloxyimino)-4-thienyl cyanide, α-(methylsulfonyloxyimino)-1-cyclopentenyl acetonitrile, α-(methylsulfonyloxyimino)-1-cyclohexenyl acetonitrile, α-(methylsulfonyloxyimino)-1-cycloheptenyl acetonitrile, α-(methylsulfonyloxyimino)-1-cyclooctenyl acetonitrile, α-(trifluoromethylsulfonyloxyimino)-1-cyclopentenyl acetonitrile, α-(trifluoromethylsulfonyloxyimino)-cyclohexyl acetonitrile, α-(ethylsulfonyloxyimino)-ethyl acetonitrile, α-(propylsulfonyloxyimino)-propyl acetonitrile, α-(cyclohexylsulfonyloxyimino)-cyclopentyl acetonitrile, α-(cyclohexylsulfonyloxyimino)-cyclohexyl acetonitrile, α-(cyclohexylsulfonyloxyimino)-1-cyclopentenyl acetonitrile, α-(ethylsulfonyloxyimino)-1-cyclopentenyl acetonitrile, α-(isopropylsulfonyloxyimino)-1-cyclopentenyl acetonitrile, α-(n-butylsulfonyloxyimino)-1-cyclopentenyl acetonitrile, α-(ethylsulfonyloxyimino)-1-cyclohexenyl acetonitrile, α-(isopropylsulfonyloxyimino)-1-cyclohexenyl acetonitrile, α-(n-butylsulfonyloxyimino)-1-cyclohexenyl acetonitrile, α-(methylsulfonyloxyimino)-phenyl acetonitrile, α-(methylsulfonyloxyimino)-p-methoxyphenyl acetonitrile, α-(trifluoromethylsulfonyloxyimino)-phenyl acetonitrile, α-(trifluoromethylsulfonyloxyimino)-p-methoxyphenyl acetonitrile, α-(ethylsulfonyloxyimino)-p-methoxyphenyl acetonitrile, α-(propylsulfonyloxyimino)-p-methylphenyl acetonitrile, and α-(methylsulfonyloxyimino)-p-bromophenyl acetonitrile.

Also, oxime sulfonate-based acid generators disclosed in Japanese Unexamined Patent Publication, First Publication No. Hei 9-208554 ([Chemical Formula 18] and [Chemical Formula 19] of paragraphs [0012] to [0014]) and oxime sulfonate-based acid generators disclosed in WO2004/074242A2 (Examples 1 to 40 on pages 65 to 85) can also be preferably used.

Examples of preferred compounds include those shown below.

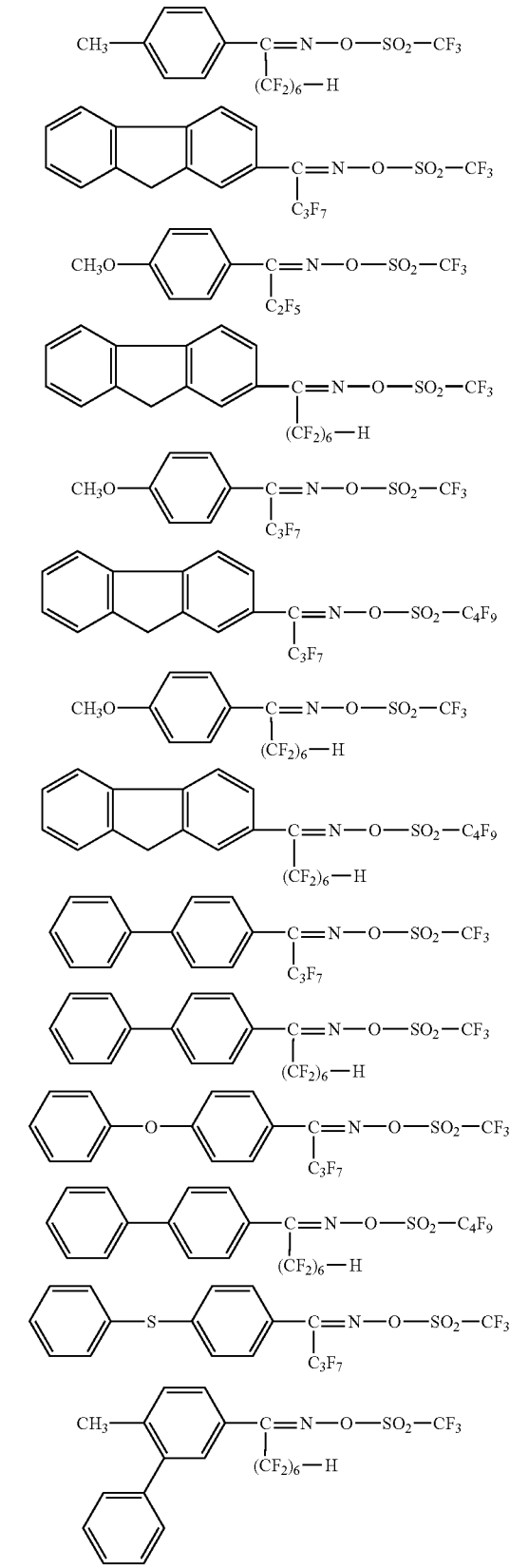

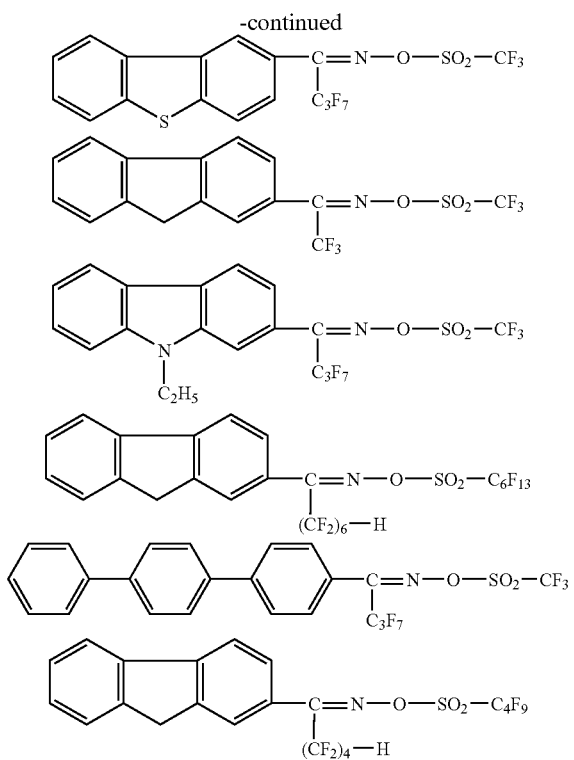

Of the compounds listed above, the four compounds shown below are preferred.

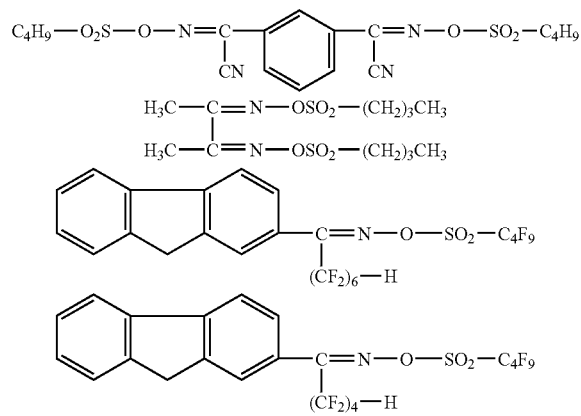

Of the diazomethane acid generators, specific examples of bisalkyl or bisarylsulfonyl diazomethanes include bis(isopropylsulfonyl)diazomethane, bis(p-toluenesulfonyl)diazomethane, bis(1,1-dimethylethylsulfonyl)diazomethane, bis(cyclohexylsulfonyl)diazomethane, and bis(2,4-dimethylphenylsulfonyl)diazomethane.

Also, diazomethane-based acid generators disclosed in Japanese Unexamined Patent Publication, First Publication No. Hei 11-035551, Japanese Unexamined Patent Publication, First Publication No. Hei 11-035552, and Japanese Unexamined Patent Publication, First Publication No. Hei 11-035573 can also be preferably used.

Examples of the poly(bissulfonyl)diazomethanes include 1,3-bis(phenylsulfonyl diazomethylsulfonyl)propane, 1,4-bis(phenylsulfonyl diazomethylsulfonyl)butane, 1,6-bis(phenylsulfonyl diazomethylsulfonyl)hexane, 1,10-bis(phenylsulfonyl diazomethylsulfonyl)decane, 1,2-bis(cyclohexylsulfonyl diazomethylsulfonyl)ethane, 1,3-bis(cyclohexylsulfonyl diazomethylsulfonyl)propane, 1,6-bis(cyclohexylsulfonyl diazomethylsulfonyl)hexane, and 1,10-bis(cyclohexylsulfonyl diazomethylsulfonyl)decane that are disclosed in Japanese Unexamined Patent Publication, First Publication No. Hei 11-322707.

In the present invention, an onium salt containing a fluorinated alkylsulfonic acid ion as an anion is particularly preferably used as the component (B), and chemical formula (b-0-2) and trifluoromethanesulfonate of bis(4-tert-butylphenyl)iodonium are more preferred. When the onium salt is used, the effect of the present invention (particularly the effect of suppressing deterioration of sensitivity of the resist composition) is remarkably exerted.

The component (B) can be used either alone, or in combinations of two or more different components.

The content of the entire component (B) is from 0.5 to 30 parts by mass, and preferably from 1 to 10 parts by mass, based on 100 parts by mass of the component (A). Ensuring that the content is within the above ranges enables sufficient carrying out of pattern formation. It is preferred because a uniform solution is obtained and storage stability is improved.

(Amine (D))

In a resist composition of the present invention, in order to improve the resist pattern shape and the post exposure stability of the latent image formed by the pattern-wise exposure of the resist layer, an amine (D) is added.

In the present invention, the term "amine" is a compound in which at least one of the hydrogen atoms of ammonia $NH_3$ is substituted with a substituent containing carbon atoms (organic group).

The amine (D) may be either an aliphatic amine or an aromatic amine, of which an aliphatic amine is preferred.

In the present invention, the term "aliphatic" is a relative concept used in relation to the term "aromatic", and defines a group or compound that contains no aromaticity.

More preferably, it is a compound substituted with a hydrocarbon group which may include a substituent such as a hydroxyl group. The hydrocarbon group is particularly preferably alkyl group or hydroxyalkyl group of 12 or less carbon atoms.

Herein, the "hydrocarbon group which may include a substituent" may be a chain-like or cyclic group. Also, two or more of the hydrogen atoms among the three hydrogen atoms of ammonia $NH_3$ may be substituted with a hydrocarbon group and are combined to form a ring containing a nitrogen atom.

Specific examples of the amine (D) include monoalkylamines such as n-hexylamine, n-heptylamine, n-octylamine, n-nonylamine, and n-decylamine; dialkylamines such as diethylamine, di-n-propylamine, di-n-heptylamine, di-n-octylamine, and dicyclohexylamine; trialkylamines (tertiary alkylamines) such as trimethylamine, triethylamine, tri-n-propylamine, tri-n-butylamine, tri-n-hexylamine, tri-n-pentylamine, tri-n-heptylamine, tri-n-octylamine, tri-n-nonylamine, tri-n-decanylamine, and tri-n-dodecylamine; and alkanolamines such as diethanolamine, triethanolamine, diisopropanolamine, triisopropanolamine, di-n-octanolamine, and tri-n-octanolamine.

Of these amines, tertiary amines are preferred because of good lithographic characteristics. Tertiary alkylamines such as trimethylamine, triethylamine, tri-n-propylamine, tri-n-butylamine, tri-n-hexylamine, tri-n-pentylamine, tri-n-heptylamine, tri-n-octylamine, tri-n-nonylamine, tri-n-decanylamine, and tri-n-dodecylamine; and tertiary alkanolamines such as triethanolamine, triisopropanolamine, and tri-n-octanolamine are more preferred, and tertiary alkanolamines are most preferred. Of the tertiary alkanolamines, triethanolamine is most preferred. When tertiary alkanolamines are used, the effects of the present invention can be remarkably obtained.

In the present invention, the term "tertiary amine" means a compound in which all three hydrogen atoms of ammonia $NH_3$ are substituted with a substituent containing carbon atoms.

The term "tertiary alkanolamine" means a compound in which at least one of the substituents containing carbon atoms is a hydrocarbon group containing a hydroxy group among the "tertiary amines".

The term "tertiary alkylamine" means a compound in which all of the substituents containing carbon atoms are alkyl groups among the "tertiary amines".

The term "alkyl group", unless stated otherwise, includes a straight-chain, branched-chain, or cyclic monovalent saturated hydrocarbon group.

The amine (D) may be used alone, or a combination of two or more different amines may be used.

The amine (D) is usually used in an amount within a range from 0.01 to 5.0 parts by mass, 0.05 to 1.0 parts by mass, and 0.1 to 0.6 parts by mass, based on 100 parts by mass of the component (A).

(Acetic Acid)

The resist composition of the present invention contains acetic acid. Effects of the present invention are obtained by inclusion of acetic acid. Particularly, in lithographic characteristics, a pattern shape with high rectangularity can be obtained upon formation of a resist pattern.

The amount of acetic acid is preferably from 0.1 to 20 parts by mass, more preferably from 0.1 to 15 parts by mass, and most preferably from 0.5 to 12 parts by mass, based in 100 parts by mass of the component (A). Ensuring that this amount is at least as large as the lower limits of the above ranges enables the effect of suppressing deterioration of sensitivity with time of the resist composition to be obtained, whereas ensuring that the amount is no greater than the upper limits enables characteristics of the resist composition to be maintained without variation.

(Component (S))

The resist composition of the present invention is produced by dissolving the materials in an organic solvent (S) (hereinafter referred sometimes to as component (S)).

The component (S) contains ethyl lactate.

The content of ethyl lactate in the organic solvent (S) may be 10% by mass or more, preferably 20% by mass or more, more preferably 40% by mass or more, still more preferably 60% by mass or more, and most preferably 100% by mass. Ensuring that the lower limit is 10% by mass or more enables solubility of the component (B) to be improved.

The component (S) may be any solvent capable of dissolving the various components used to generate a uniform solution, and one or more solvents selected from known materials used as the solvents for conventional chemically amplified resists can be used with ethyl lactate.

Examples of the solvent include lactones such as γ-butyrolactone; ketones such as acetone, methyl ethyl ketone, cyclohexanone, methyl isoamyl ketone, and 2-heptanone; polyhydric alcohols and derivatives thereof, such as ethylene glycol, diethylene glycol, propylene glycol, and dipropylene glycol; derivatives of polyhydric alcohols, for example, compounds having an ester bond such as ethylene glycol monoacetate, diethylene glycol mono acetate, propylene glycol monoacetate, or dipropylene glycol monoacetate, and compounds having an ether bond such as monomethyl ether, monoethyl ether, monopropyl ether, monobutyl ether or monophenyl ether of the polyhydric alcohols or the compounds having an ester bond; and cyclic ethers such as dioxane, and esters such as methyl lactate, methyl acetate, ethyl acetate, butyl acetate, methyl pyruvate, ethyl pyruvate, methyl methoxypropionate, and ethyl ethoxypropionate. Of these solvents, lactones such as γ-butyrolactone, propylene glycol monomethyl ether acetate (PGMEA) and propylene glycol monomethyl ether (PGME) are preferred, and γ-butyrolactone and PGMEA are more preferred.

For example, when ethyl lactate is mixed with PGMEA, a mass ratio ethyl lactate:PGMEA is preferably from 1:9 to 9:1, and more preferably from 2:8 to 8:2.

When ethyl lactate is mixed with γ-butyrolactone, the mass ratio of the former to the later is preferably from 70:30 to 95:5.

There are no particular restrictions on the amount used of the component (S), although the amount should be set in accordance with the coating film thickness required, at a concentration that enables favorable application of the solution to a substrate or the like. Typically, the quantity of solvent is set so that the solid fraction concentration of the resist composition falls within a range from 2 to 20% by mass, and preferably from 5 to 15% by mass.

(Optional Components)

In order to prevent any deterioration in sensitivity and improve the resist pattern shape and post exposure stability of the latent image formed by the pattern-wise exposure of the resist layer, an organic carboxylic acid, or a phosphorus oxo acid or derivative thereof (E) (hereafter referred to as component (E)) may also be added to the resist composition of the present invention as another optional component.

In view of the effects of the present invention, the acid preferably has a proper strength. The pKa value is preferably 2 or more, more preferably 3 or more, and most preferably from 4 to 6. Ensuring that this pKa value is at least as large as the lower limit of the above range enables good resolution to be maintained without removal of an acid dissociable, dissolution inhibiting group of the resin as the component (A) in the case of a positive resist composition, whereas ensuring that the pKa value is no greater than the upper limit enables the effect of suppressing deterioration of sensitivity with time of the resist composition to be improved.

Examples of suitable organic carboxylic acids include malonic acid, citric acid, malic acid, succinic acid, benzoic acid, and salicylic acid, of which malonic acid and salicylic acid are more preferred.

Examples of suitable phosphorus oxo acids or derivatives thereof include phosphoric acid or ester derivatives thereof such as phosphoric acid, din-butyl phosphate and diphenyl phosphate; phosphonic acid or ester derivatives thereof such as phosphonic acid, dimethyl phosphonate, di-n-butyl phosphonate, phenylphosphonic acid, diphenyl phosphonate, and dibenzyl phosphonate; and phosphinic acid or ester derivatives thereof such as phosphinic acid and phenylphosphinic acid, of which phosphonic acid is particularly preferred.

The component (E) is typically used in an amount within a range from 0.01 to 5.0 parts by weight based on 100 parts by weight of the component (A).

Other miscible additives can also be added to the resist composition of the present invention according to need, and examples include additive resins for improving the properties of the resist film, surfactants for improving the coating properties, dissolution inhibitors, plasticizers, stabilizers, colorants, halation prevention agents, and dyes.

The resist composition of the present invention has such an effect that, in a resist composition obtained by dissolving components in an organic solvent containing ethyl lactate, deterioration of sensitivity with time of the resist composition is suppressed and also a resist pattern having required lithographic characteristics can be formed.

The reason is not clear but is considered as follows. That is, ethyl lactate contained in the organic solvent partially reacts with the amine in the resist composition to form lactic acid, thus causing deterioration of sensitivity with time of the resist composition. In the present invention, production of lactic acid is suppressed by the addition of acetic acid and thus deterioration of sensitivity with time of the resist composition is suppressed.

It is also considered that, since acetic acid is volatilized upon prebaking, characteristics of the resist composition are maintained even if acetic acid is added. For example, without deterioration of pattern shape, a resist composition can be provided with required lithographic characteristics.

(Method for Forming Resist Pattern)

The resist pattern forming method of the present invention can be conducted in the following manner.

Namely, the above resist composition is first applied on a substrate such as a silicon wafer using a spinner, and prebaking is then conducted under temperature conditions of 80 to 150° C., for a period of 40 to 120 seconds, and preferably for 60 to 90 seconds. The resist film thus formed is selectively exposed with an ArF or KrF exposure apparatus by irradiating ArF or KrF excimer laser light through a desired mask pattern, and PEB (post exposure baking) is then conducted under temperature conditions of 80 to 150° C., for a period of 40 to 120 seconds, and preferably for 60 to 90 seconds.

Subsequently, a developing treatment is conducted using an alkali developing solution such as a 0.1 to 10% by mass aqueous solution of tetramethylammonium hydroxide.

In this manner, a resist pattern that is faithful to the mask pattern can be obtained.

An organic or inorganic anti-reflective film may also be provided between the substrate and the applied layer of the resist composition.

There are no particular restrictions on the wavelength used for the exposure, and an ArF excimer laser, KrF excimer laser, $F_2$ excimer laser, or other radiation such as EUV (extreme ultraviolet) VUV (vacuum ultraviolet), EB (electron bean), X-rays or soft X-ray radiation can be used. The present invention is particularly effective for use with an ArF or KrF excimer laser.

EXAMPLES

The present invention will now be described by way of examples, but the present invention is not limited by these examples.

Examples 1 to 4 and Comparative Examples 1 to 4

The respective components shown in Table 1 were mixed and then dissolved to prepare a positive resist composition solution.

TABLE 1

|  | (A) | (B) | (D) | (O) | (E) | (S) |
|---|---|---|---|---|---|---|
| Example 1 | (A)-1 [100] | (B)-1 [2.5] (B)-2 [2.5] | (D)-1 [0.18] | (O)-1 [0.05] | (E)-1 [1] | (S)-1 [750] |
| Example 2 | (A)-1 [100] | (B)-1 [2.5] (B)-2 [2.5] | (D)-1 [0.18] | (O)-1 [0.05] | (E)-1 [3] | (S)-1 [750] |
| Example 3 | (A)-1 [100] | (B)-1 [2.5] (B)-2 [2.5] | (D)-1 [0.18] | (O)-1 [0.05] | (E)-1 [5] | (S)-1 [750] |
| Example 4 | (A)-1 [100] | (B)-1 [2.5] (B)-2 [2.5] | (D)-1 [0.18] | (O)-1 [0.05] | (E)-1 [10] | (S)-1 [750] |
| Comparative Example 1 | (A)-1 [100] | (B)-1 [2.5] (B)-2 [2.5] | (D)-1 [0.18] | (O)-1 [0.05] | — | (S)-1 [750] |
| Comparative Example 2 | (A)-1 [100] | (B)-1 [2.5] (B)-2 [2.5] | (D)-1 [0.18] | (O)-1 [0.05] | (E)-2 [10] | (S)-1 [750] |
| Comparative Example 3 | (A)-1 [100] | (B)-1 [2.5] (B)-2 [2.5] | (D)-1 [0.18] | (O)-1 [0.05] | (E)-3 [10] | (S)-1 [750] |
| Comparative Example 4 | (A)-1 [100] | (B)-1 [2.5] (B)-2 [2.5] | (D)-1 [0.18] | (O)-1 [0.05] | (E)-4 [2] | (S)-1 [750] |

Abbreviations in Table 1 have the following meanings. Also, the numerical value in parenthesis indicates the amount (parts by mass).

(A)-1: Copolymer represented by formula (A)-1 shown below, l:m:n=60:15:25 (molar ratio), Mw=10,000, Mw/Mn=2.0
(B)-1: Compound represented by formula (B)-1 shown below
(B)-2: Bis(4-tert-butylphenyl)iodonium trifluoromethanesulfonate
(D)-1: Triethanolamine
(O)-1: Surfactant XR-104 (trade name, manufactured by Dainippon Ink and Chemicals, Inc.)
(E)-1: Acetic acid
(E)-2: Lactic acid
(E)-3: Diphenolic acid
(E)-4: Pyridine
(S)-1: Ethyl lactate

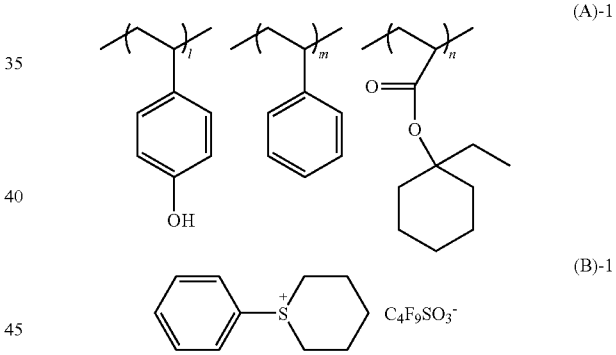

The resulting positive resist composition solution was evaluated after storage at −20° C. for 2 weeks, and storage at 30° C. for 2 weeks.

(Evaluation of Sensitivity and Hole Pattern Shape)

A composition for an organic anti-reflective film "AR-3" (manufactured by Rohm and Haas Company) was applied on an 8 inch silicone wafer using a spinner and then heated at 220° C. for 60 seconds to form an organic anti-reflective film having a film thickness of 60 nm. The above positive resist composition solution stored at −20° C. for 2 weeks was uniformly applied on the organic anti-reflective film using a spinner, and then dried by prebaking on a hot plate at 115° C. for 60 seconds to form a resist film having a film thickness of 380 nm.

Then, the thus obtained resist film was selectively exposed through a binary mask using a KrF exposure apparatus (wavelength: 248 nm) NSR-S203B (manufactured by Nikon Corporation; NA (numerical aperture)=0.68, σ=0.75).

After a PEB treatment was conducted at 125° C. for 60 seconds, the resist film was developed with a 2.38% by weight aqueous solution of tetramethylammonium hydroxide at 23° C. for 60 seconds, rinsed with pure water for 30 seconds and shaken dry.

Then, the resist film was dried by heating at 100° C. for 60 seconds to form a hole pattern (pitch: 360 nm) having a diameter of 180 nm. The optimum light exposure EOP (sensitivity) (unit: mJ/cm$^2$) upon formation of the hole pattern was determined and the size (diameter) (unit: nm) of the hole in EOP and the hole pattern shape were evaluated.

Each positive resist composition solution stored at 30° C. for 2 weeks was subjected to the same treatment as described above and a hole pattern was formed at an optimum light exposure SOP in each positive resist composition solution stored at −20° C. for 2 weeks, and then the size (diameter) (unit: nm) of the hole in EOP and the hole pattern shape were evaluated. The difference (unit: nm) in the size (diameter) of the hole between the positive resist composition solution stored at −20° C. for 2 weeks and the positive resist composition solution stored at 30° C. for 2 weeks was calculated.

The resulting evaluation results are shown in Table 2.

The calculated difference indicates that deterioration of sensitivity with time of the resist composition is more suppressed as the absolute value decreases.

The hole pattern shape was observed by scanning electron microscope (a measuring SEM, manufactured by Hitachi, Ltd. under the trade name of S-9220) and then evaluated according to the following criteria.
A: Hole pattern, the inner wall of which has high rectangularity
B1: T-TOP shape
B2: Not worthy of evaluation because of severe thickness loss of pattern The same evaluation results of the hole pattern shape were obtained in both cases where the resist composition is stored at −20° C. and 30° C. for 2 weeks.

TABLE 2

| | PAB (° C.) | PEB (° C.) | EOP (mJ/cm$^2$) | Pattern size (nm) After storage at −20° C. | Pattern size (nm) After storage at 30° C. | Difference | Shape |
|---|---|---|---|---|---|---|---|
| Example 1 | 115 | 125 | 46 | 179.0 | 190.8 | 11.8 | A |
| Example 2 | 115 | 125 | 46 | 179.9 | 174.2 | −5.7 | A |
| Example 3 | 115 | 125 | 46 | 179.5 | 168.9 | −10.6 | A |
| Example 4 | 115 | 125 | 46 | 181.6 | 180.3 | −1.3 | A |
| Comparative Example 1 | 115 | 125 | 46 | 183.7 | 201.3 | 17.6 | A |
| Comparative Example 2 | 115 | 125 | 43 | 172.1 | 197.4 | 25.3 | B1 |
| Comparative Example 3 | 115 | 125 | 38.5 | 173.7 | 183.3 | 9.6 | B2 |
| Comparative Example 4 | 115 | 125 | 47.5 | 178.5 | 203.3 | 24.8 | B1 |

As is apparent from the results shown in Table 2, the resist compositions of the Examples showed a small absolute value of the difference (11.8 nm, 5.7 nm, 10.6 nm, and 1.3 nm) and a favorable hole pattern shape as compared with the resist compositions containing no acetic acid of the Comparative Examples.

The resist compositions of Comparative Example 3 showed a small absolute value of difference (9.6 nm), severe thickness loss of the resist pattern and poor hole pattern shape.

The above results revealed that, according to the present invention, deterioration of sensitivity with time of the resist composition is suppressed and also the resulting resist composition has required lithographic characteristics.

INDUSTRIAL APPLICABILITY

The present invention provides a resist composition prepared by dissolving components in an organic solvent containing ethyl lactate, which suppresses deterioration of sensitivity with time and also has required lithographic characteristics, and a method for forming a resist pattern. Therefore, the present invention is industrially very useful.

The invention claimed is:

1. A resist composition comprising an organic solvent (S) containing ethyl lactate, a resin component (A) which exhibits changeable alkali solubility under an action of an acid, an acid generator component (B) which generates an acid upon exposure, an amine (D) and acetic acid in an amount from 0.1 to 20 parts by mass based on 100 parts by mass of component (A), which are dissolved in the organic solvent, wherein
the acid generator component (B) comprises a compound represented by chemical formula (b-0-1) or (b-0-2):

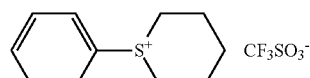
(b-0-1)

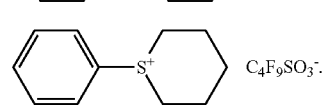
(b-0-2)

2. The resist composition according to claim 1, wherein the amine (D) is a tertiary amine.

3. The resist composition according to claim 2, wherein the tertiary amine is a tertiary alkanolamine and/or a tertiary alkylamine.

4. A method for forming a resist pattern, comprising the steps of forming a resist film on a substrate using a resist composition according to any one of claims 1 to 3;
exposing the resist film; and developing the resist film to form a resist pattern.

* * * * *